US007329933B2

(12) United States Patent
Zhe et al.

(10) Patent No.: US 7,329,933 B2
(45) Date of Patent: Feb. 12, 2008

(54) SILICON MICROPHONE WITH SOFTLY CONSTRAINED DIAPHRAGM

(75) Inventors: Wang Zhe, Singapore (SG); Miao Yubo, Singapore (SG)

(73) Assignee: Silicon Matrix Pte. Ltd., Singapore (SG)

( * ) Notice: Subject to any disclaimer, the term of this patent is extended or adjusted under 35 U.S.C. 154(b) by 530 days.

(21) Appl. No.: 10/977,693

(22) Filed: Oct. 29, 2004

(65) Prior Publication Data

US 2006/0093171 A1 May 4, 2006

(51) Int. Cl.
*H01L 29/84* (2006.01)

(52) U.S. Cl. ...................... 257/419; 381/186; 381/335; 381/398; 381/405; 181/164

(58) Field of Classification Search .................. 438/53, 438/689; 257/419; 381/150, 174, 176, 182, 381/186, 191, 335, 347, 396, 398, 399, 403, 381/405, 423; 181/132, 144, 147, 148, 154, 181/163, 164, 157
See application file for complete search history.

(56) References Cited

U.S. PATENT DOCUMENTS

| | | | | |
|---|---|---|---|---|
| 5,146,435 A | 9/1992 | Bernstein | 367/181 |
| 5,452,268 A | 9/1995 | Bernstein | 367/181 |
| 5,490,220 A | 2/1996 | Loeppert | 381/168 |
| 7,132,307 B2 * | 11/2006 | Wang et al. | 438/53 |
| 7,146,016 B2 * | 12/2006 | Pedersen | 381/175 |
| 2002/0106828 A1 | 8/2002 | Leoppert | 438/53 |

FOREIGN PATENT DOCUMENTS

WO WO 01/20948 A 3/2001
WO WO 02/15636 A 2/2002

OTHER PUBLICATIONS

"Piezoelectric Bimorph Microphone Built on Micromachined Parylene Diaphragm", by Meng-Nian Nin et al., Jrnl. of Microelectromechanical Sys., vol. 12, No. 6, Dec. 2003, pp. 892-898.

"Micromachined High-Aspect-Ratio Parylene Beam and Its Application to Low-Frequency Seismometer", by Yuji Suzuki et al., 2003 IEEE, pp. 486-489.

* cited by examiner

*Primary Examiner*—Lex Malsawma
*Assistant Examiner*—Khiem D Nguyen
(74) *Attorney, Agent, or Firm*—Saile Ackerman LLC; Stephen B. Ackerman

(57) ABSTRACT

A microphone sensing element and a method for making the same are disclosed. The sensing element has a diaphragm and an attached electrical lead-out arm preferably made of polysilicon that are separated by an air gap from an underlying backplate region created on a conductive silicon substrate. The backplate region has acoustic holes created by removing an oxide filling in a continuous trench that surrounds hole edges and by removing oxide to form the air gap. The diaphragm is softly constrained along its edge by an elastic element that connects to a surrounding rigid polysilicon layer. The elastic element is typically a polymer such as parylene having a Young's modulus substantially less than that of the diaphragm. First and second electrodes are connected to the diaphragm through the lead-out arm and to the substrate through polysilicon via fillings, respectively, and thereby establish a variable capacitor circuit for acoustic sensing.

11 Claims, 11 Drawing Sheets

SILICON MICROPHONE WITH SOFTLY CONSTRAINED DIAPHRAGM

FIELD OF THE INVENTION

The invention relates to a sensing element of a silicon condenser microphone and a method for making the same, and in particular, to a microphone sensing element having a diaphragm that is constrained along its edges by an elastic polymer that relieves intrinsic stress and ensures maximum compliance for a desired frequency range.

BACKGROUND OF THE INVENTION

The silicon based condenser microphone also known as an acoustic transducer has been in a research and development stage for more than 20 years. Because of its potential advantages in miniaturization, performance, reliability, environmental endurance, low cost, and mass production capability, the silicon microphone is widely recognized as the next generation product to replace the conventional electret condenser microphone (ECM) that has been widely used in communication, multimedia, consumer electronics, hearing aids, and so on. Of all the designs, the capacitive condenser microphone has advanced the most significantly in recent years. The silicon condenser microphone is typically comprised of two basic elements which are a sensing element and a pre-amplifier IC device. The sensing element is basically a variable capacitor constructed with a movable compliant diaphragm, a rigid and fixed perforated backplate, and a dielectric spacer to form an air gap between the diaphragm and backplate. The pre-amplifier IC device is basically configured with a voltage bias source (including a bias resistor) and a source follower preamplifier.

Unlike the ECM which has stored charge on either its backplate or diaphragm, the silicon microphone depends on the external bias voltage to pump the required charge into its variable capacitor. The diaphragm vibration induced by any sound signal will cause the change in capacitance as the charge is constantly maintained. The resulting voltage change is converted into a low impedance voltage output by the source follower preamplifier. In a typical ECM microphone, the diaphragm and backplate are separated by more than 10 microns and an electret bias of several hundred volts is preset by using an ion implantation process to bring the microphone sensitivity to the desired range. For a silicon microphone, the spacing between the diaphragm and backplate elements could be a few microns and an external bias voltage of about 5 to 10 volts is applied to bring the microphone to the working condition.

The success of the silicon condenser microphone is largely attributed to the fact that its structure can be embodied in various forms with most of the materials and processing techniques adopted from the semiconductor industry. The diaphragm is usually made of silicon or polysilicon although silicon nitride/metal or a composite with oxide/polysilicon/metal/polymer has also been used. Likewise, the backplate may be constructed from silicon or polysilicon with glass, nickel, polyimide/metal, or nitride/metal being alternative materials. The dielectric spacer layer that defines the air gap between the diaphragm and backplate is usually made of a nitride and/or an oxide.

However, the silicon condenser microphone has unique processing requirements that differ from semiconductor processing standards. For example, the uncertain intrinsic stress associated with the deposition process for thin semiconductor films is problematic in the sense that it can significantly affect the compliance of the silicon microphone diaphragm. If the stress is too high, the diaphragm can either buckle or become stiffened. Since the diaphragm plays a key role in determining sensitivity and frequency response performance, the diaphragm must be as compliant as possible within a given frequency range which is difficult to achieve considering the intrinsic stress variation in thin films. To address this issue, U.S. Pat. No. 5,146,435 and U.S. Pat. No. 5,452,268 to Bernstein suggested the use of a stress-free single crystal silicon diaphragm suspended with a few flexible springs. Unfortunately, the implementation of supporting springs requires some slot cuttings on the microphone diaphragm which introduces an acoustic leakage problem. The fabrication of a thin diaphragm on a silicon substrate, as suggested by the prior art, is also a very challenging task for volume production.

In U.S. Pat. No. 5,490,220 to Loeppert and PCT Patent No. WP 02/15636 to Petersen, a "free plate" concept is disclosed that allows the thin film diaphragm to be floating within certain constraints. The floating diaphragm can have its intrinsic stress relaxed after removal of sacrificial layers. However, the floating plate design requires a complex structural definition and a complicated fabrication method. Moreover, it is difficult to ascertain where the diaphragm is anchored due to the gaps between the diaphragm and constraints following the sacrificial release and drying process.

In U.S. patent application Ser. No. 2002/0106828A1, Loeppert proposes a wafer bonding method to fabricate a single crystal diaphragm with its edge supported by micro pillars. However, even a small amount of bonding induced stress may still result in an uncertainty in mechanical compliance for a thin silicon membrane. PCT patent application Ser. No. WO 01/20948 A2 discloses a CMOS MEMS diaphragm which is a composite membrane formed by patterned oxide-metal-poly layers and polymer coating and fillings. Unfortunately, it is difficult to control the strain gradient of the composite semiconductor membrane. Moreover, the polymer coating and filling makes the strain gradient issue worse because of thermal expansion mismatching.

Therefore, an improved structure of a sensing element is needed that addresses the intrinsic stress issue and simplifies the fabrication process of a silicon microphone.

SUMMARY OF THE INVENTION

One objective of the present invention is to provide a sensing element of a silicon microphone wherein a diaphragm is softly constrained in order to reduce an intrinsic stress therein.

A further objective of the present invention is to provide a simple fabrication method of forming a sensing element in a silicon condenser microphone according to the first objective.

A still further objective of the present invention is to provide a method of forming a sensing element of a silicon microphone according to the second objective that is cost effective.

These objectives are achieved with a silicon microphone sensing element which features a circular or square diaphragm with an edge constrained by a soft polymeric material. The soft polymer constraint is strong enough to hold the diaphragm in place during a vibrational mode and is connected to a rigid supporting layer that is anchored to a substrate. Furthermore, the soft polymer constraint is able to relieve the intrinsic stress in the diaphragm which is typically a thin film of polysilicon. Just like button fasteners, the soft polymer constraint joins the diaphragm and the rigid supporting layer near the edge of the diaphragm. Having a Young's modulus substantially lower than that of the diaphragm, the soft polymer constraint is able to relieve the intrinsic stress in the diaphragm. The diaphragm is separated by an air gap from an underlying substrate having a front side with a backplate region with acoustic holes formed therein. A back hole is formed below the backplate region from the back side of the substrate. Furthermore, there is a rectangular shaped electrical lead-out arm extending from the diaphragm edge. The lead-out arm is attached to an overlying first electrode which is used to establish a variable capacitor circuit. There is a second electrode that is electrically connected to the substrate through the rigid supporting layer. After a sound signal strikes the diaphragm, a vibration is induced that changes the capacitance in the variable capacitor circuit.

In a first embodiment, the soft constraint covers a substantial portion of the rigid supporting layer but only a portion of the diaphragm near its edge in order to avoid any strain gradient issue caused by thermal expansion mismatching. A "C" shaped trench effectively separates a flexible diaphragm that is preferably polysilicon from a rigid supporting layer that is the same material as the diaphragm. Likewise, a set of linear trenches that are connected to the "C" shaped trench define the lead-out arm. The rigid supporting layer has a plurality of horizontal sections surrounding the diaphragm and its leadout arm that are coplanar with and of equal thickness to the diaphragm. There is a dielectric stack between the substrate and rigid supporting layer which is comprised of one or more sacrificial oxide and/or nitride layers. The rigid polysilicon supporting layer is solidly anchored to the substrate by filling into a plurality of ring shaped trenches in the dielectric stack that contact the substrate. To ensure that the ring shaped trenches are completely filled, the width of the trenches should not be more than twice the polysilicon thickness. There is a first set of holes in the diaphragm formed in a circular array at an equal distance from the "C" shaped trench. A second set of holes arrayed in a circular fashion are formed in the rigid polysilicon layer and are equally spaced from the "C" shaped trench.

Above the rigid polysilicon supporting layer is a thick dielectric layer for the purpose of reducing the parasitic capacitance between the diaphragm and the substrate. A first electrode is disposed on the thick dielectric spacer layer where there is no polysilicon layer underneath and contacts the short rectangular shaped electrical lead-out arm of the diaphragm. A second electrode is connected to the substrate through the via filling of the polysilicon layer into a plurality of trenches in the dielectric stack.

The soft polymer constraint may be parylene or other polymer materials that are high temperature endurable and resistive to most corrosive chemicals. The conformal parylene coating fills undercut cavities created by an isotropic etching process of the dielectric layer through first and second sets of holes and the "C" shaped trench. To avoid any thermal expansion mismatch, there is no parylene coating on the central area of the diaphragm, except above the diaphragm edges. To allow for electrical wiring, there should be no parylene on the first and second electrodes.

A release step is performed from the back side of the substrate to remove the oxide that fills the trenches in the substrate and thereby forms a backplate with acoustic holes therein. The release step also removes a portion of the dielectric stack that results in an air gap between the diaphragm and backplate. A variable capacitor circuit can therefore be established between the substrate and diaphragm by wiring the two electrodes In a second embodiment, a circular or square shaped diaphragm and its electrical lead-out arm are similar to those described in the first embodiment. The diaphragm and a rigid supporting layer are separated as before by a ring shaped trench with a pattern of holes on either side that are filled by the soft constraint. Unlike the first embodiment, the rectangular lead-out arm extending from one side of the diaphragm to the first electrode may be a non-planar arm wherein its bonding pad section is raised by a polysilicon (poly1)/oxide stack and thus is a greater distance from the substrate than a lower section that is connected to and coplanar with the diaphragm. The rigid supporting layer is preferably a doped polysilicon (poly2) layer and is anchored to the substrate by filled trenches within the dielectric layers. Unlike the first embodiment, substrate parasitic capacitance is reduced by forming a plurality of oxide filled trenches in the substrate below the lead-out arm and first electrode (and below the poly1/oxide stack).

The present invention is also a method of fabricating a silicon microphone sensing element according to the first and second embodiments. One process sequence requires eight photomasks to fabricate the first embodiment. In the exemplary embodiment, a first mask is used to form trenches in the substrate that are subsequently filled with oxide and define the shape of acoustic holes in the backplate region. A second mask is employed to form openings in the dielectric stack that will be filled with the semiconductor (polysilicon) layer. The third mask is used to form openings in the polysilicon layer and a fourth mask is employed to form openings in the thick dielectric spacer layer above the diaphragm and in locations where electrodes will contact the substrate via polysilicon filled trenches and where electrodes are formed on the electrical lead-out arm. A fifth mask process defines the shape and location of first and second electrodes and then a sixth mask is employed to form the "C" shaped trench that defines the diaphragm and the adjacent holes in the rigid polysilicon layer and diaphragm that will later be filled with the soft constraint. A seventh mask involves forming openings in the soft polymer constraint above the diaphragm and first and second electrodes while an eighth mask is employed for the purpose of forming a back hole up to the acoustic holes in the backplate region.

The present invention also encompasses a second process sequence with seven masks to form the previously described second embodiment. A first mask is used to form two trench patterns in a silicon substrate that are subsequently filled with thermal oxide. The first trench pattern is disposed below a subsequently formed poly1/oxide stack and is used to reduce substrate parasitic capacitance as mentioned previously. The second trench pattern defines the shape of the acoustic holes in a backplate region. After the first polysilicon (poly1) and thermal oxide layers are formed on the front side of the substrate, a second mask is employed for an etch step that selectively leaves a poly1/oxide stack only above the first trench pattern that is disposed directly below a subsequently formed first electrode and lead-out arm. A dielectric stack is deposited on the front side of the substrate. Thereafter, a third mask is used to etch trench as well as via openings including a first "C" shaped trench in the dielectric stack down to the substrate which will subsequently be filled with a second polysilicon (poly2) layer. A fourth mask is used to form first and second metal electrodes on the poly2 layer. Next, a fifth mask is employed to etch the poly2 layer to form a second "C" shaped trench that defines the diaphragm, a set of trenches that defines the lead-out arm, hole patterns adjacent to the second "C" shaped trench, and opening wherein first and second electrodes will be formed. After a soft polymer material such as parylene is deposited to fill the trenches, holes, and openings, a sixth photomask is employed to etch the parylene to form a soft constraint with a ring shape that covers the edge of the diaphragm, the second "C" shaped trench, and the hole patterns. A seventh mask is used to etch a back hole below the diaphragm from the back side of the substrate up to the acoustic holes in the back plate region. Finally, a release step removes the thermal oxide in the second trench pattern to form a perforated backplate with acoustic holes and then removes a portion of the dielectric stack that results in an air gap between the diaphragm and backplate.

DETAILED DESCRIPTION OF THE INVENTION

Figure 1A:
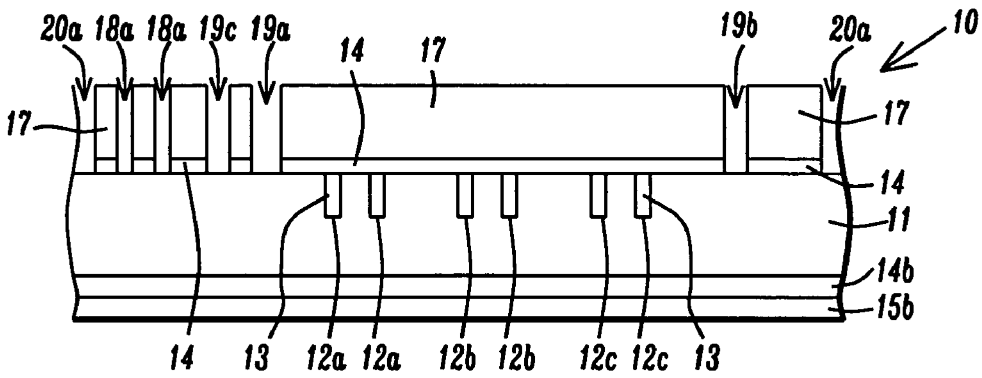
FIGS. 1*a*, 2, 3*a*, 4*a*, 5*a*, 6*a*, and 7 are cross-sectional views which illustrate a process sequence involving eight photo mask steps that form a silicon microphone sensing element with a softly constrained diaphragm according to a first embodiment of the present invention.
Figure 1B:
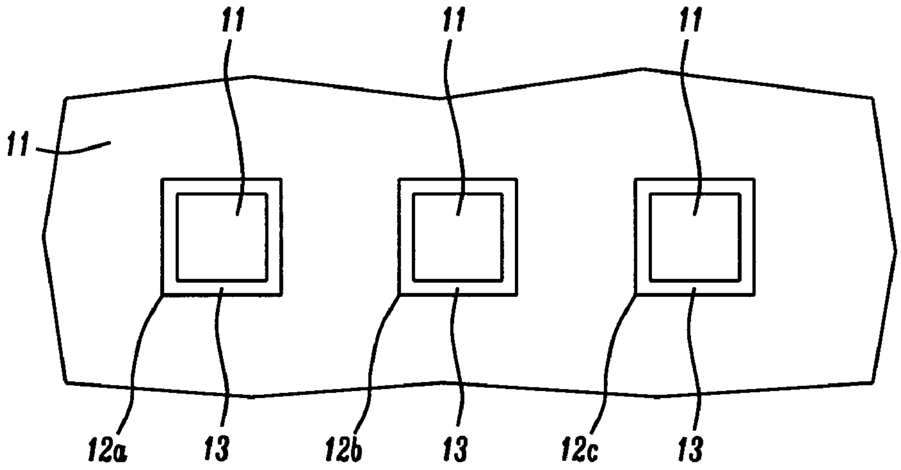
FIGS. 1*b*, 3*b*, 4*b*, 5*b*, and 6*b* are top views of the silicon microphone sensing element shown in FIGS. 1*a*, 3*a*, 4*a*, 5*a*, and 6*a*, respectively.

The present invention is a silicon microphone sensing element in which an intrinsic stress in a diaphragm component is relieved by a novel design. The inventors have discovered that a high performance microphone sensing element may be constructed wherein a flexible diaphragm is suspended above acoustic holes in a backplate region of a substrate and held in place along its edge by a soft polymer constraint that is attached to a rigid supporting layer. This discovery is based on the understanding that since the sound pressure transduced by microphones is very low and in normal working conditions should be not more than 10 Pa in amplitude, it is unnecessary to apply any rigid and strong constraints to a diaphragm, especially for a thin and small diaphragm in a silicon condenser microphone. A concept is proposed herein to apply a constraint on a diaphragm that is soft enough to relax any intrinsic stress but strong enough to hold the diaphragm in place while in stationary and vibrational modes. The present invention is also a method of fabricating a silicon microphone sensing element with a softly constrained diaphragm. The figures are not necessarily drawn to scale and the relative sizes of various elements in the drawings may be different than in an actual device.

Figure 7:
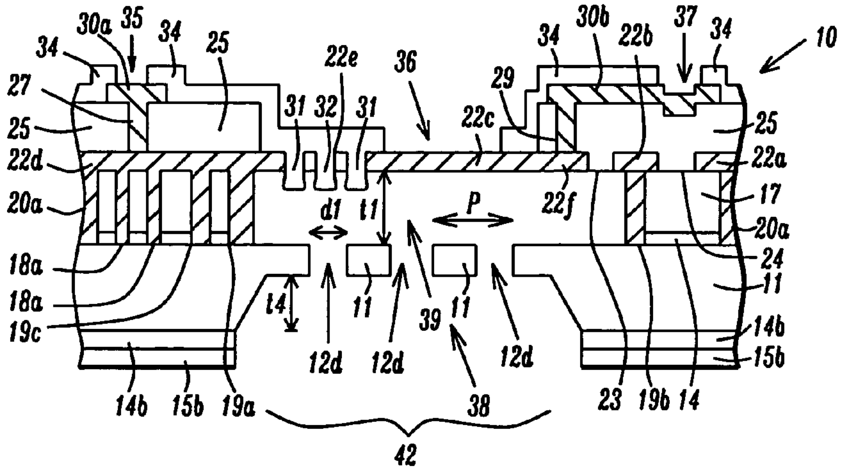

One embodiment of the silicon microphone sensing element according to the present invention will be described first and the novel process sequence used to form the first embodiment will be described in a later section. It is understood that a microphone sensing element based on a material other than silicon may be fabricated by alternative embodiments described herein. Referring to FIG. 7, a microphone sensing element 10 is constructed on a substrate 11 such as silicon which may have an n-type dopant and a resistivity as low as 0.01 ohms-m. The substrate 11 preferably has front and back sides that are polished. There is a thermal oxide layer 14 about 3000 Angstroms thick on the front side of substrate 11 and above the thermal oxide layer is a PSG layer 17 about 3.7 microns thick. The back side of substrate 11 has a stack of layers comprised of a lower thermal oxide layer 14*b* (about 3000 Angstroms thick) on the substrate and an upper PECVD silicon nitride layer 15*b* with a thickness of about 1500 Angstroms.

An air cavity also known as a back hole 38 with sloping sidewalls is formed in the substrate 11 wherein the top of the back hole near the front side has a smaller width than the bottom of the back hole in the back side. The top and bottom of the back hole have a square shape as seen from a top view that will be described later. Optionally, the back hole 38 may have vertical sidewalls such that its top and bottom have equal widths. The back hole opening in the back side extends vertically (perpendicular to the substrate) through the thermal oxide layer 14*b* and silicon nitride layer 15*b*. The back hole 38 is bounded on its top side by a backplate region 42 of the substrate which has a thickness $t_2$ of about 5 to 15 microns. Within the backplate region is a plurality of acoustic holes 12*d* having a width $d_1$ of about 10 to 20 microns. The acoustic holes 12*d* may have a square or circular shape and are arrayed in multiple rows and multiple columns with a pitch P of 20 to 40 microns along an x-axis (lengthwise dimension) and along a y-axis or widthwise direction (not shown). Note that the backplate region 42 with acoustic holes 12*d* is aligned below a diaphragm 22*c* and is separated from the diaphragm by an air gap 39 with a thickness $t_1$ of about 4 microns.

Vertical sections of a rigid semiconductor layer also known as a supporting layer are preferably comprised of doped polysilicon and are formed in the dielectric spacer stack comprised of thermal oxide layer 14 and PSG layer 17. Alternatively, the supporting layer may be a single or composite layer comprised of silicon, nickel, gold, aluminum, copper, nitride, or other semiconductor materials. In the exemplary embodiment, the vertical sections are comprised of polysilicon filled trenches 18*a*, 19*a*-19*c*, 20*a* and 19*d* (not shown) that have a bottom formed on the substrate 11 outside the backplate region 42. Filled trenches 18*a*, 19*a*, 19*c*, 20*a* together with an overlying horizontal polysilicon layer form the rigid polysilicon layer 22*d*. Trench 19*b* and an overlying horizontal polysilicon layer forms the rigid polysilicon layer 22*b* while filled trench 20*a* adjacent to trench 24 and an overlying horizontal polysilicon layer form the rigid polysilicon layer 22*a*. In other words, there are three horizontal sections 22*a*, 22*b*, 22*d* of the rigid polysilicon layer disposed on the vertical sections 22*a*, 22*b*, 22*d*, respectively, wherein the vertical section 22*d* is comprised filled trenches. The air gap 39 is bounded on the sides by the filled trenches 19$a$, 19$b$. The patterns of the filled trenches are shown in a top perspective in FIG. 8.

Returning to FIG. 7, a key component of the microphone sensing element 10 is the diaphragm 22$c$ which may be a circular or square shaped element. In the exemplary embodiment, the diaphragm is a circular and planar element made of polysilicon having an outer edge 22$e$ and a diameter of about 400 to 1000 microns and a thickness of about 1 to 3 microns. The diaphragm 22$c$ has an electrical lead-out arm 22$f$ extending from its side along an x-axis. In one embodiment, the lead-out arm has a rectangular shape with a lengthwise direction of about 50 microns along the x-axis and a width of about 20 microns. The end of the lead-out arm 22$f$ is separated from a horizontal section 22$b$ by a trench 23. Continuing away from the diaphragm 22$c$ along the x-axis, the horizontal section 22$b$ is separated from the horizontal section 22$a$ by a trench 24. The horizontal sections 22$a$, 22$b$, 22$d$ are coplanar with the diaphragm 22$c$ and lead-out arm 22$f$. It is understood that the vertical and horizontal sections 22$a$, 22$b$, 22$d$ and the arm 22$f$ have the same composition as the diaphragm 22$c$ and are preferably doped polysilicon.

A trench 32 having a width of 3 to 6 microns is formed that defines the outer edge 22$e$ of the diaphragm 22$c$ and separates the diaphragm from the horizontal section 22$d$. In the embodiment where the diaphragm has a circular shape, the trench 32 has a "C" like ring shape. From a top perspective shown in FIG. 8, the trench 32 is a circular feature except where it intersects the arm 22$f$ and is depicted by a dashed line since the trench is covered by a soft constraint 34. Returning to FIG. 7, a plurality of openings 31 such as holes with a diameter of 3 to 6 microns is formed on either side of the trench 32. For example, a first set of holes is formed an equal distance from the trench 32 and is arrayed in a circular fashion within the diaphragm 22$c$ while a second set of holes is formed an equal distance from the trench and is arrayed in a circular pattern within the horizontal section 22$d$.

A silicon rich silicon nitride (SRN) layer 25 is disposed on the lead-out arm 22$f$ and on the horizontal sections 22$a$, 22$b$, 22$d$ and serves to reduce parasitic capacitance between the substrate and diaphragm. Note that the SRN layer 25 also fills the trenches 23, 24 adjacent to the horizontal section 22$b$ but preferably does not extend over the filled trench 20$a$ or above the holes 31 or trench 32, The SRN layer 25 is from 3 to 5 Angstroms thick and is not necessarily planar, especially over the trench 24. One opening 27 is formed in the SRN layer 25 that contacts the horizontal section 22$d$ and a second opening 29 is formed in the SRN layer that contacts the lead-out arm 22$f$.

Figure 9:
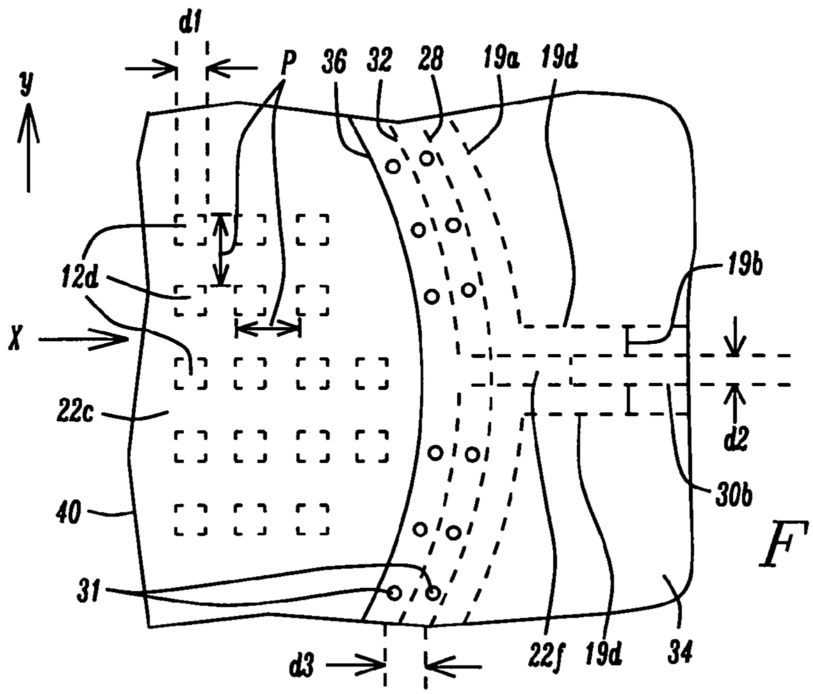
FIG. 9 is a top view showing an enlarged portion of FIG. 8.

The openings 27, 29 are filled with a conductive layer that may be a comprised of a lower Cr layer about 300 to 800 Angstroms thick and an upper Au layer between 5000 and 10000 Angstroms thick. Alternatively, the conductive layer may be a single layer or composite layer comprised of Al, Ti, Ta, Cu, Ni or other conductive metals used in the art. The conductive layer has a portion 30$b$ that functions as a first electrode which is electrically connected to the diaphragm 22$c$ through the electrical lead-out arm 22$f$, and has a portion 30$a$ which serves as a second electrode in contact with substrate 11 through rigid polysilicon layer 22$d$. The first electrode 30$b$ in this embodiment is disposed on the SRN layer 25 and has a rectangular shaped arm which connects to the rectangular arm 22$f$ through the opening 29 at its one end and crosses over the horizontal section 22$b$ and the trench 24 (FIG. 9).

A key feature is that the diaphragm 22$c$ is supported along its outer edge 22$e$ by an elastic polymer layer hereafter referred to as a soft constraint 34 that has a Young's modulus substantially less than that of the diaphragm and yet strong enough to support the diaphragm. The soft constraint 34 may be a single layer or composite layer selected from a group of polymeric materials including, but not limited to, parylene, polymethylmethacrylate (PMMA), Teflon, polydimethylsiloxane (PDMS), and SU8 photoresist. The elasticity of the soft constraint 34 is substantially greater than that of polysilicon or another semiconductor material that may be used in the diaphragm 22$c$. Owing to conformal coating, the soft constraint 34 has an upper section that is non-planar and a lower section within the air gap 39 which is formed when filling the undercuts created by an isotropic etching process in the dielectric spacer stack through the openings 31 and trench 32. The upper section of the soft constraint 34 is disposed on the SRN layer 25, portions of the first electrode 30$b$ and second electrode 30$a$, as well as on portions of lead-out arm 22$f$ and diaphragm 22$c$. However, the overlap of the soft constraint on the diaphragm is minimized to avoid any strain gradient issue induced by thermal expansion mismatching. Therefore, the opening 36 in the soft constraint exposes most of the top surface of the diaphragm 22$c$. Additional openings 35, 37 in the soft constraint allow wiring to contact the second electrode 30$a$ and first electrode 30$b$, respectively, as shown from a top perspective in FIG. 6$b$.

It is understood that a silicon microphone is also comprised of a voltage bias source, a source follower preamplifier, and wiring to connect the first and second electrodes to complete a variable capacitor circuit. However, these features are not shown in order to simplify the drawings and direct attention to the key components of the present invention. When a sound signal impinges on the diaphragm either from the front side or through the back hole 38, acoustic holes 12$d$, and air gap 39, a vibration results wherein the diaphragm moves up and down relative to the substrate and a capacitance change is recorded. An important feature is that the silicon microphone sensing element 10 has a diaphragm not subject to any influence of thin film stress inherent in polysilicon layers or other films formed by a semiconductor process. As a result, the silicon microphone sensing element described herein is believed to have a higher performance, better production yields and better device reliability than previously achieved in prior art. Furthermore, the microphone sensing element can be constructed with a simple and cost effective process to be described later.

Figure 8:
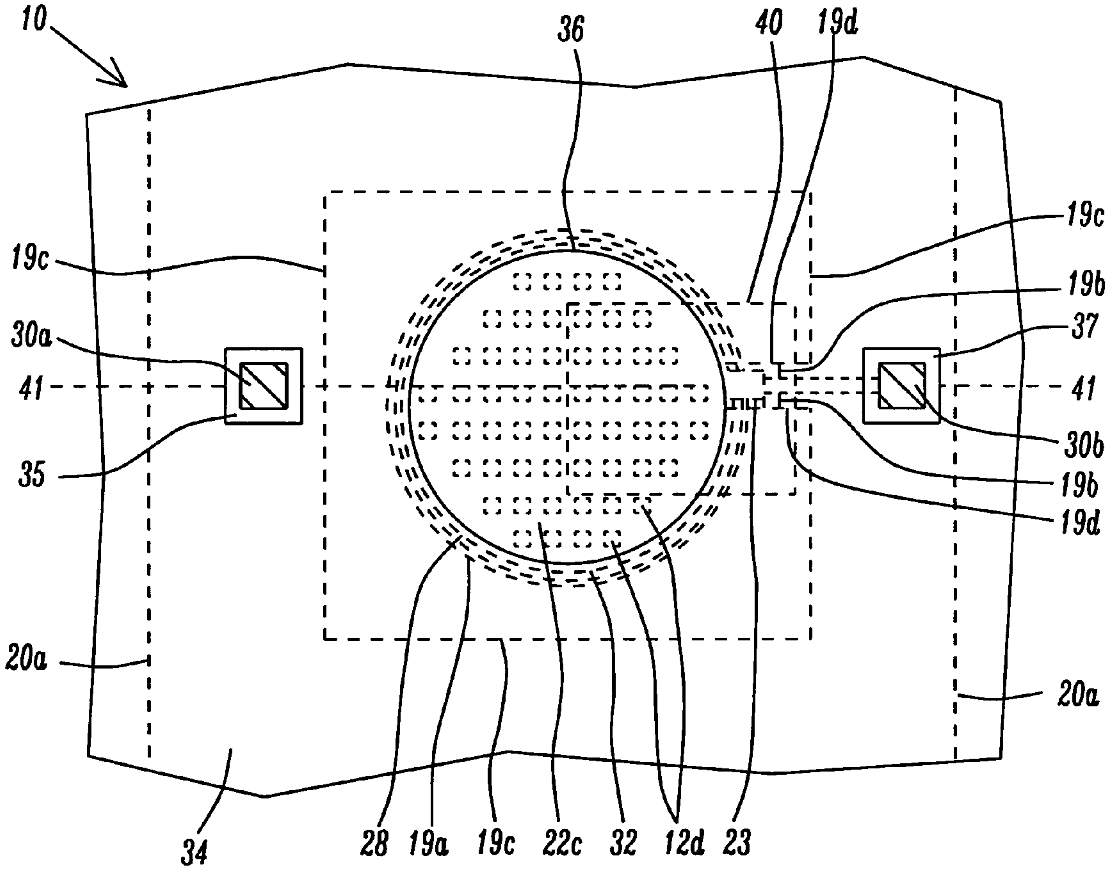
FIG. 8 is a top view of a silicon microphone sensing element shown in FIG. 7 that was formed by the process sequence according to the first embodiment.

The microphone sensing element 10 is further characterized by a top view in FIG. 8. A cross-section along the axis 41-41 (x-axis) represents the view illustrated in FIG. 7. Trench features covered by the soft constraint 34 are shown as dashed lines. Note that filled trench 20$a$ has a ring shape that extends around the perimeter of the sensing element 10 but only two of the four sides are depicted. Trench 19$c$ has a ring shape that is open on one side near the axis 41-41 where two parallel trenches 19$d$ connect the trench 19$c$ to the "C" shaped trench 19$a$. Trench 19$b$ is perpendicular to the axis 41-41 and connects the two trenches 19$d$. Although a second electrode 30$a$ is shown on the axis 41-41, the second electrode may be located elsewhere as long as it contacts the substrate 11 through the rigid polysilicon layer 22$d$. Moreover, there may be more than one second electrode 30$a$ formed in silicon microphone sensing element 10. Note that the trench 32 is generally concentric with the trench 19$a$. The opening 28 is shown as dashed line with an "O" ring shape between the trenches 19$a$, 32. Sections of the dielectric spacer stack (not shown) surrounded by trench 20*a*, by trench 18*a*, and by the connected trenches 19*a*-19*d* are sometimes referred to as isolation regions. The acoustic holes 12*d* are also shown as features framed by dashed lines since the acoustic holes are disposed in the substrate below the diaphragm 22*c*.

An enlarged view of a portion of FIG. 8 outlined by dashed lines 40 is shown in FIG. 9. As mentioned earlier, the acoustic holes 12*d* may have a square shape with a width and length $d_1$ and may be arrayed in multiple rows and columns in a pattern having a pitch P in lengthwise and widthwise directions. Optionally, the acoustic holes may have a circular shape. Spacing between neighboring holes 31 on opposite sides of the trench 32 is a distance $d_3$ of about 20 to 30 microns. A portion of the first electrode 30*b* is shown (covered by the soft constraint) and has a rectangular shape with a lengthwise dimension along the x-axis and a width $d_2$ of about 50 to 100 microns in a direction parallel to the y-axis.

Figure 15:
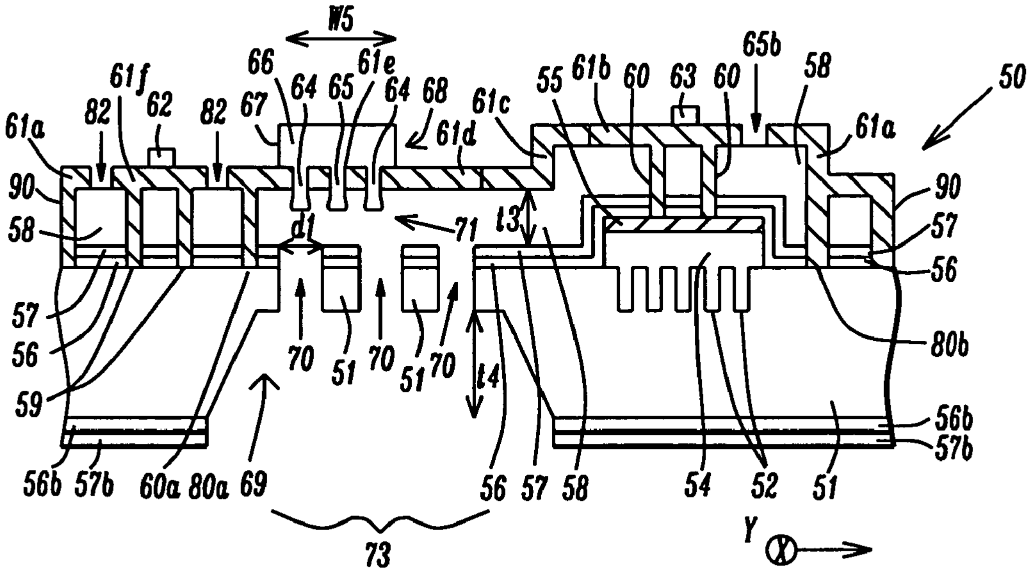
Figure 16:
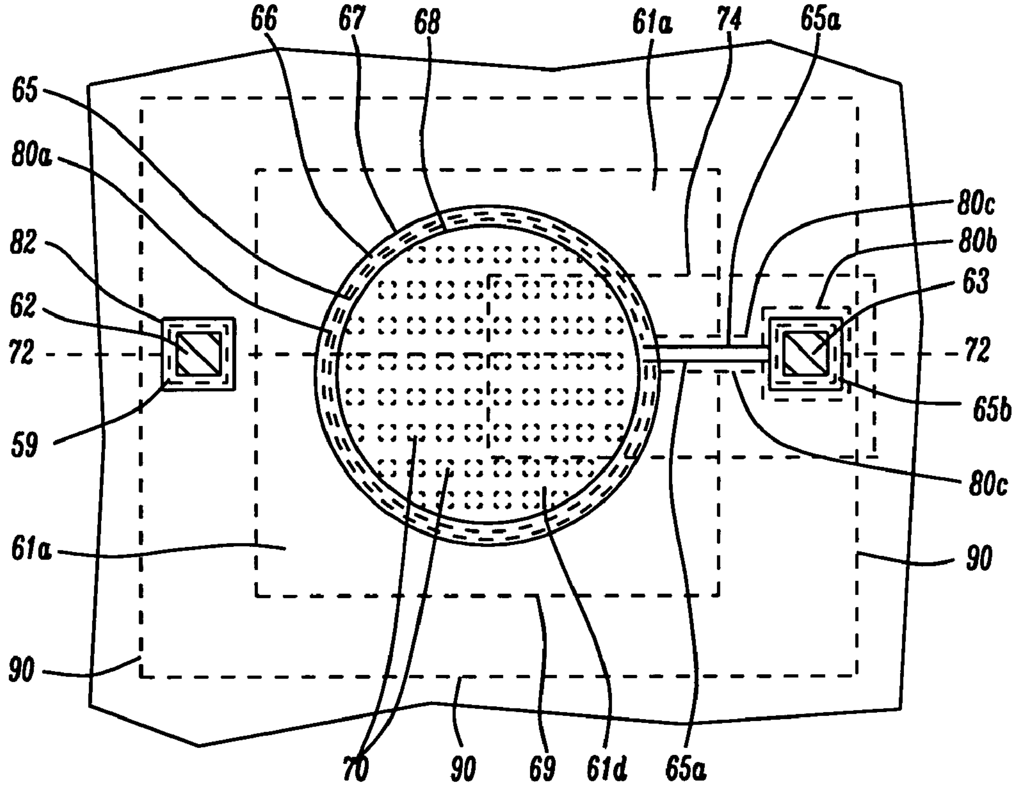
FIG. 16 is a top view of the silicon microphone sensing element shown in FIG. 15 that was formed by a process sequence according to the second embodiment.
Figure 17:
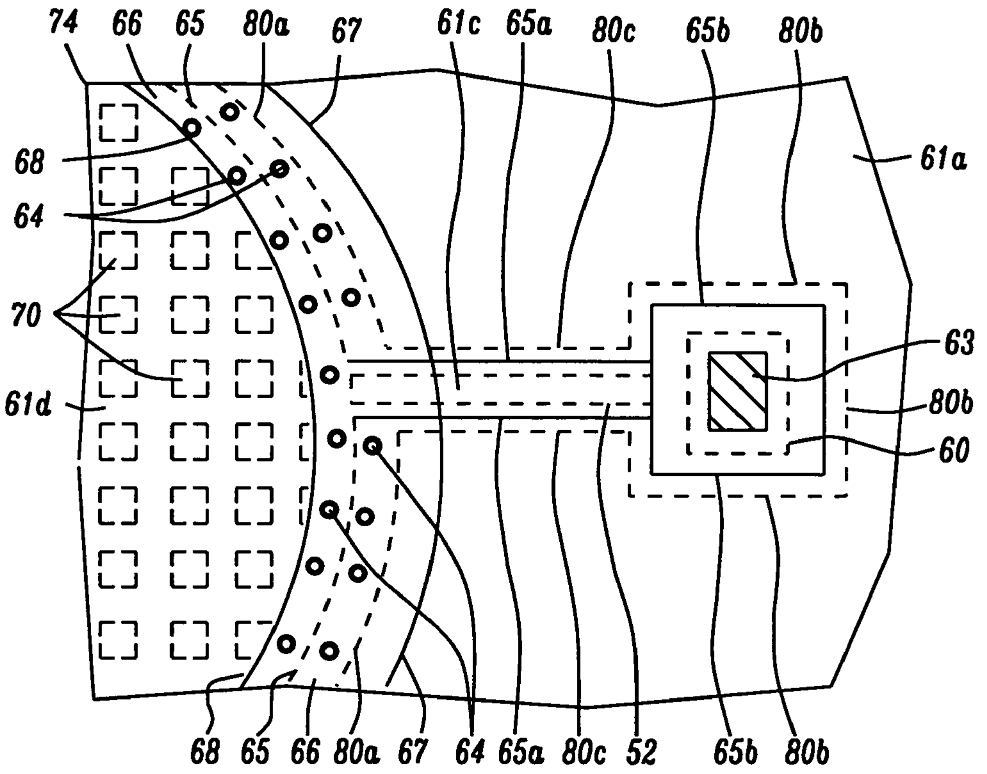
FIG. 17 is a top view showing an enlarged portion of FIG. 16.

According to the present invention, there is a second embodiment of a microphone sensing element 50 having a softly constrained diaphragm as depicted in FIGS. 15-17. Referring to FIG. 15, a microphone sensing element 50 is fabricated on a substrate 51 such as silicon which may have an n-type dopant and a resistivity as low as 0.01 ohms-cm. The substrate 51 preferably has front and back sides that are polished. Certain regions on the front side of the substrate 51 have trenches 52 filled with an oxide layer 54 that is about 2 microns thick above the trenches. Preferably, the trenches are aligned below an electrical lead-out arm 61*c* and first electrode 63 to be described in a later section. The oxide layer 54 and an overlying undoped first polysilicon (poly 1) layer 55 about 0.3 to 0.5 micron thick form a stack in the shape of one or more rectangular islands that cover the trenches 52 and a portion of the substrate 51 around the trenches. The oxide filled trenches serve to reduce substrate parasitic capacitance as appreciated by those skilled in the art.

There is a thermal oxide layer 56 about 3000 Angstroms thick on the front side of substrate 51 that covers the poly1/oxide stack. Above the thermal oxide layer 56 is a LPCVD silicon nitride layer 57 having a thickness of about 1500 Angstroms. A sacrificial oxide layer 58 such as LPCVD low temperature oxide, TEOS, PECVD oxide, or PSG layer about 4 microns thick is disposed on the silicon nitride layer 57. The layers 56, 57, 58 form a dielectric spacer stack. The back side of substrate 51 has a hardmask comprised of a lower thermal oxide layer 56*b* with the same thickness as the thermal oxide layer 56 and a LPCVD silicon nitride layer 57*b* with same thickness as LPCVD silicon nitride layer 57 on the thermal oxide layer 56*b*.

A back hole 69 with sloping sidewalls is formed in the substrate 51 wherein the top of the back hole near the front side has a smaller width than the bottom in the back side of the substrate. Both top and bottom have a square shape as seen from a top view that will be described later. Alternatively, the back hole may have vertical sidewalls wherein its top and bottom have the same width. The back hole opening in the back side extends vertically (perpendicular to the substrate) through the thermal oxide layer 56*b* and silicon nitride layer 57*b*. The back hole 69 is bounded on its top side by a backplate region 73 of the substrate which has a thickness $t_2$ of about 5 to 15 microns. Within the backplate region is a plurality of acoustic holes 70 having a diameter $d_1$ of 10 to 20 microns. The acoustic holes 70 may have a circular or square shape and may be arrayed in multiple rows and multiple columns with a pitch P of 20 to 40 microns along an x-axis and along a y-axis (not shown). Note that the backplate region 73 with acoustic holes 70 is aligned below a diaphragm 61*d* and is separated from the diaphragm by an air gap 71 with a thickness $t_3$ of about 4 microns. The air gap 71 is bounded on the sides by the vertical sections 60, 80*a*. The acoustic holes 70 extend vertically to the substrate through the overlying thermal oxide layer 56 and silicon nitride layer 57.

Vertical sections of a rigid supporting layer also referred to as a rigid semiconductor layer are formed in the dielectric stack comprised of thermal oxide layer 56, silicon nitride layer 57, and oxide layer 58. In the exemplary embodiment, the vertical sections are comprised of polysilicon filled trenches 59, 60, 80*a*, 90 having a width between 2 and 4 microns that are formed outside the backplate region 73. Optionally, other semiconductor films as mentioned in the first embodiment may be used for the rigid supporting layer. Filled trench 59 has a continuous ring like shape and together with an overlying horizontal polysilicon layer forms the rigid foundation 61*f* for the second electrode 62. Filled trench 60 has a continuous ring like shape and together with an overlying horizontal polysilicon layer forms the rigid foundation 61*b* for the first electrode 63. Filled trenches 80*b*, 90 and an overlying horizontal polysilicon layer form a rigid foundation 61*a*. From a top perspective in FIG. 16, the trench 59 forms a ring that surrounds the second electrode 62 and the trench 60 forms a second ring that surrounds the first electrode 63.

Returning to FIG. 15, a key component of the microphone sensing element 50 is the diaphragm 61*d* which may be a circular or square shaped element. In the exemplary embodiment, the diaphragm is a circular and planar element made of polysilicon and having an outer edge 61*e*, a diameter of about 400 to 800 microns, and a thickness of about 1 to 3 microns. The diaphragm 61*d* has an electrical lead-out arm 61*c* extending from its side along the x-axis. One end of the lead-out arm 61*c* is attached to a horizontal section of rigid foundation 61*b*. The lead-out arm 61*c* may be non-planar with a lower first section adjoining the diaphragm that is formed a distance $t_3$ from the substrate while an upper second section that is connected to the horizontal section of foundation 61*b* is a greater distance than $t_3$ from the substrate. Thus, the horizontal section of foundation 61*b* is coplanar with the upper section of the lead-out arm and the horizontal section of foundation 61*a* is coplanar with the diaphragm and lower section of the lead-out arm 61*c*.

The trenches 59, 80*a*, 80*b*, 90 have bottoms disposed on the substrate 51 while trench 60 has a bottom formed on the poly 1 layer 55 above the filled trenches 52. It is understood that the rigid foundations 61*a*, 61*b*, 61*f*, arm 61*c*, and diaphragm 61*d* have the same composition and are preferably doped polysilicon.

There is a trench 65 that defines the outer edge 61*e* of the diaphragm 61*d* and a set of trenches 65*a* (FIG. 17) that define the outer edge of the lead-out arm 61*c*. There is a first electrode 63 disposed on the horizontal section of foundation 61*b* and a second electrode 62 disposed on the horizontal section of foundation 61*f*. First electrode 63 and second electrode 62 may be comprised of a lower Cr layer about 600 to 800 Angstroms thick and an upper Au layer between 5000 and 10000 Angstroms thick. Optionally, the first electrode and second electrode may be a single layer or composite layer comprised of Al, Ti, Ta, Cu, Ni, or other conductive materials. In one embodiment, the first and second electrodes have a square shape from a top view and a length and width from 50 to 100 microns.

Another key feature is that the diaphragm 61*d* is supported along its outer edge 61*e* by an elastic polymer layer also referred to as a soft constraint 66 that has a Young's modulus substantially less than the diaphragm and an elasticity higher than the diaphragm and yet strong enough to support the diaphragm. The soft constraint 66 may a single layer or composite layer selected from a group of polymeric materials including, but not limited to, parylene, polymethylmethacrylate (PMMA), polydimethylsiloxane (PDMS), Teflon, and SU8 photoresist. The soft constraint 66 has an upper section that is planar and a lower section within the air gap 71 which are connected through the holes 64 and trench 65. The lower section is formed by filling the polymer layer into the undercut cavities which are created by an isotropic etching process in the dielectric spacer stack under the holes 64 and trench 65. The upper section of the soft constraint 66 is in the shape of an "O" like ring and has a width $w_5$ of about 40 to 60 microns that is sufficiently wide to cover all of the holes 64. As mentioned in the first embodiment, the overlap of the soft constraint on the diaphragm is minimized to avoid any strain gradient issue induced by thermal expansion mismatching. In addition, the amount of overlap on the adjacent rigid polysilicon layer is considerably reduced compared with the first embodiment.

From a top perspective shown in FIG. 16, the trench 65 has a "C" shape and is a circular feature except where it intersects the lead-out arm 61*c*. A cross-section along the axis 72-72 (x-axis) represents the view illustrated in FIG. 15. Trench features covered by the horizontal sections of foundations 61*a*, 61*b*, 61*f* are shown as dashed lines. Note that filled trench 90 has a ring shape that extends around the perimeter of the sensing element 50. Trench 80*a* has a "C" like shape around the diaphragm and is interrupted only where the lead-out arm attaches to the diaphragm. Trench 80*a* is connected by two parallel trenches 80*c* formed on either side of the axis 72-72 to a ring like trench 80*b* that surrounds the poly 1/oxide stack. The inner wall of the filled trench 80*a* defines the sides of the air gap 71 while the outer wall adjoins the dielectric spacer stack. The soft constraint 66 is shown as an "O" like circular feature with an outer edge 67 and an inner edge 68. First electrode 63 formed above the ring like trench 60 and second electrode 62 formed above the ring like trench 59 are disposed along the x-axis. However, the second electrode may be located elsewhere as long as it contacts the substrate 51 through the rigid foundation 61*a*.

Trench 65 has a ring shape that is open on one side near the axis 72-72 where two parallel trenches 65*a* connect the ring shaped trench 65*b* around the first electrode 63 to the "C" shaped trench 65. Trench 65 is generally concentric with the trench 80*a*. The top of the back hole 69 is also shown as a dashed line that encircles the diaphragm. Preferably, the width of top of the back hole 69 is greater than the diameter of the diaphragm 61*d*. Acoustic holes 70 are depicted as features with dashed lines since the acoustic holes are disposed in the substrate below the diaphragm 61*d*. Oxide filled trenches 52 are indicated by dashed lines to show their position relative to the lead-out arm 61*c* and diaphragm 61*d*. The rectangular shaped area within the dashed lines 74 is enlarged in FIG. 17

Referring to FIG. 17, a plurality of openings 64 such as holes with a diameter of 2 to 6 microns is formed on either side of the trench 65. For example, a first set of holes is formed an equal distance from the trench 65 and is arrayed in a circular fashion within the diaphragm 61*d* while a second set of holes is formed an equal distance from the trench and is arrayed in a circular pattern within the horizontal section of foundation 61*a*. The first set of holes and the second set of holes generally form a concentric pattern.

As mentioned earlier, the acoustic holes 70 may have a circular or square shape with a diameter $d_1$ and may be arrayed in multiple rows and columns in a pattern having a pitch P in lengthwise and widthwise directions. It is important that all acoustic holes 70 should be within the trench 65 from a top view.

Figure 18:
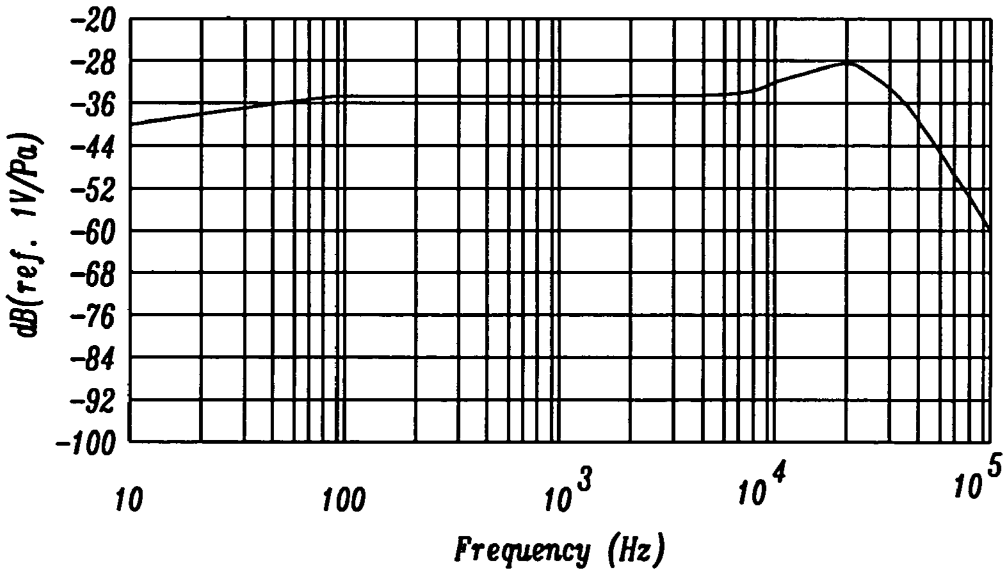
FIG. 18 is a plot of a simulated frequency response of a silicon microphone design according to the present invention.

The second embodiment enjoys similar advantages over prior art as described previously for the first embodiment. A simulation was performed using a silicon microphone sensing element according to the present invention wherein a circular polysilicon diaphragm having a diameter of 600 microns and a thickness of 1 micron is joined to the rigid support at its edge by a 5 micron wide parylene ring of the same thickness. Parylene has a Young's modulus of 4 Gpa compared with a Young's modulus of 160 Gpa for polysilicon. The perforated backplate in the silicon microphone has a 5 micron thickness and is comprised of acoustic holes 20 micron in size with a 40 micron pitch. The thickness of the air gap between the diaphragm and backplate is 4 microns. The effective capacitance for this silicon microphone is about 0.48 pF. Assuming a 100 Mpa initial stress is applied to the polysilicon diaphragm, the stress is significantly reduced to 26.5 kPa by the parylene ring. Simulation also shows that the z-deflection (maximum vibration amplitude perpendicular to x-axis) is about 36.9 nm in the center of the diaphragm for a 1 Pa pressure load. Resonant frequency is determined to be about 21 kHz. Although parylene has very different thermal properties than polysilicon, the stress induced by the thermal mismatch is only 0.16 Mpa for a 100° C. temperature change. A proprietary electro-acoustic model simulated the frequency response shown in FIG. 18 where the microphone sensitivity is about −34.7 dB (1 V/Pa reference) at 5V DC bias. These results indicate a high performance silicon microphone wherein intrinsic stress in the diaphragm has been substantially decreased.

The present invention is also a method of making the silicon microphone sensing element previously described in the first embodiment. A first process sequence illustrated in FIGS. 1*a*-7 is followed and requires a total of eight photomasks also known simply as masks. These masks are not illustrated in full detail in order to simplify the drawings. Referring to FIG. 1*a*, the microphone sensing element 10 is based on a substrate 11 that is preferably comprised of silicon and may have an n-type dopant and a resistivity of less than 0.02 ohm-cm. The substrate may be polished on both of its front and back sides wherein front side is intended to mean the surface on which the device will be built.

In the exemplary embodiment, the substrate 11 is etched through a first mask (not shown) to form a plurality of trenches having a width of about 2 to 4 microns. Only trenches 12*a*, 12*b*, 12*c* are illustrated in the drawing. From a top view (FIG. 1*b*), a portion of the front side of the substrate is shown in which each trench including trenches 12*a*, 12*b*, 12*c* has a square ring shape and encloses a region of substrate 11. Optionally, the trenches 12*a*-12*c* may have a circular shape. In one embodiment as shown in a top view (FIG. 8), the square trenches will subsequently be transformed into acoustic holes 12*d* that are arrayed in multiple rows and columns in a backplate region as described in a later section.

Returning to FIG. 1*a*, a conventional dewet process is used treat the substrate. Then a thermal oxidation as known to those skilled in the art is performed to grow a thermal oxide layer on the front and back sides that partially fills the trenches 12*a*-12*c*. Next, an oxide deposition by either PECVD or LPCVD is performed to fill the trenches. Thereafter, the oxide layer on the front and back sides of the substrate 11 is etched away to leave only the oxide filling 13 in the plurality of trenches including trenches 12a-12c that is preferably coplanar with the substrate. The resulting oxide layer 13 is comprised of both thermal oxide and PECVD or LPCVD oxide.

A second thermal oxidation is performed to grow an oxide layer 14 having a thickness of about 3000 Angstroms on the front side of the substrate and an oxide layer 14b with a similar thickness on the back side. The next step is deposition of a silicon nitride layer about 1500 Angstroms thick by a LPCVD method on the oxide layers 14, 14b. However, the silicon nitride layer on the front side is removed by an etching process leaving only the silicon nitride layer 15b on the back side. In the following step, a PSG layer 17 about 4 microns thick is then formed on the oxide layer 14. The layers 14, 17 form a dielectric stack and are referred to as sacrificial because a portion of the dielectric stack will be removed to create an air gap in a subsequent step. Oxide layer 14b and silicon nitride layer 15b are referred to as a hardmask. Alternatively, the dielectric stack may be comprised of single or composite sacrificial layers such as oxide layers, TEOS, PSG, and nitride layers and the hardmask may be a single layer of either oxide or silicon nitride. At this point, a second mask is employed to etch trenches 18a, 19a, 19b, 19c, 20a as well as trenches 19d (not shown) through the dielectric stack comprised of the PSG layer 17 and oxide layer 14 and stopping on the substrate 11. The trenches have a width of 3 to 6 microns.

Figure 2:
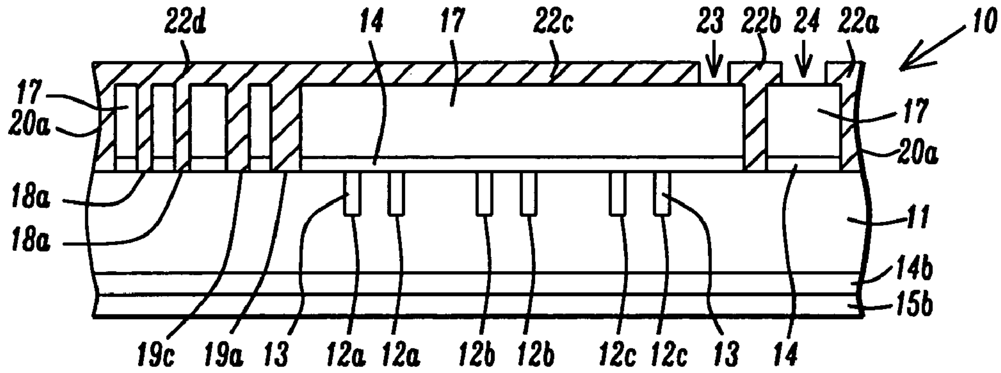

Referring to FIG. 2, a semiconductor layer that is preferably polysilicon with a thickness of approximately 1 micron and comprised of the rigid layers 22a, 22b, 22d and a diaphragm 22c with an arm 22f as described previously is deposited by a LPCVD process on the PSG layer 17 and fills the trenches 18a, 19a-19d, 20a. Alternatively, the semiconductor layer may be a single or composite layer comprised of doped polysilicon, silicon, nickel, gold, aluminum, copper, nitride, or other semiconductor materials. In the exemplary embodiment where a polysilicon layer is used to fill the aforementioned trenches, the polysilicon layer must be doped and has a stress of <100 Mpa (as supported by the simulation results mentioned previously), a sheet resistance value of <20 ohm/cm$^2$, and a strain gradient of 0.1 micron/600 micron. A third mask is used to etch the polysilicon layer to form trenches 23, 24 as described previously. The trench 24 is used to remove a portion of the polysilicon layer in a region below a subsequently formed first electrode 30b in order to reduce parasitic capacitance. Note that the rigid layers 22a, 22b, 22d each have a horizontal section and one or more vertical sections wherein a vertical section has a bottom that contacts the substrate 11 and a top that supports a horizontal section which is coplanar with the diaphragm 22c and electrical lead-out arm 22f.

Figure 3A:
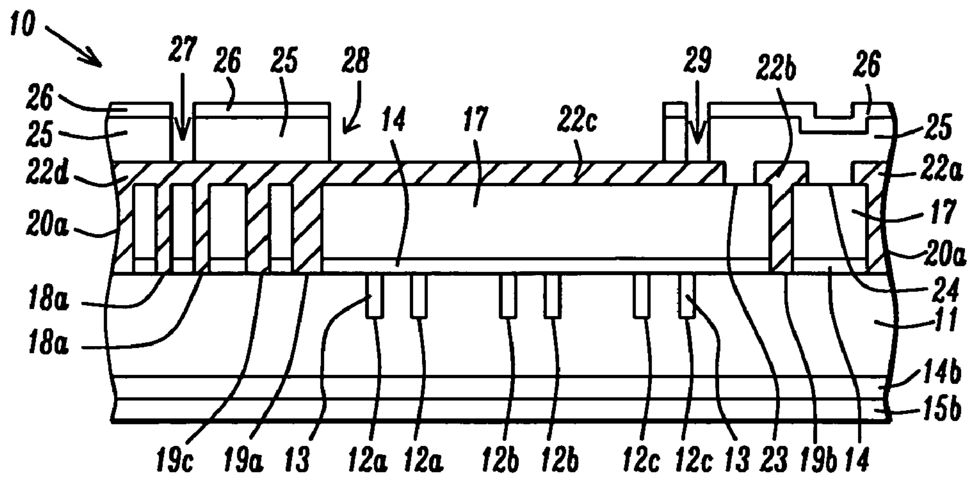

Referring to FIG. 3a, a silicon rich silicon nitride (SRN) layer 25 with a thickness of 2 to 4 microns is deposited on the rigid layers, diaphragm, lead-out arm and within the trenches 23, 24 by a PECVD or LPCVD method known to those skilled in the art. The SRN layer 25 is not necessarily planar. Next, an oxide layer 26 is formed by a PECVD technique on the SRN layer 25 and is between 3000 and 6000 Angstroms thick. The oxide layer 26 will serve as a hard mask for etching the SRN layer in a subsequent step.

A fourth mask is used for an etch process that forms an opening 27 above the horizontal section of rigid layer 22d, an opening 29 above the lead-out arm 22f, and a large opening 28 that uncovers the diaphragm 22c and a portion of the adjoining lead-out arm. The etch process may have a first step that selectively removes oxide layer 26 in the presence of a photoresist mask (not shown). During a second etch step through the thick SRN layer 25, the photoresist mask is likely to be consumed but the remaining oxide layer 26 serves as a hard mask to prevent erosion of the underlying SRN layer.

Figure 3B:
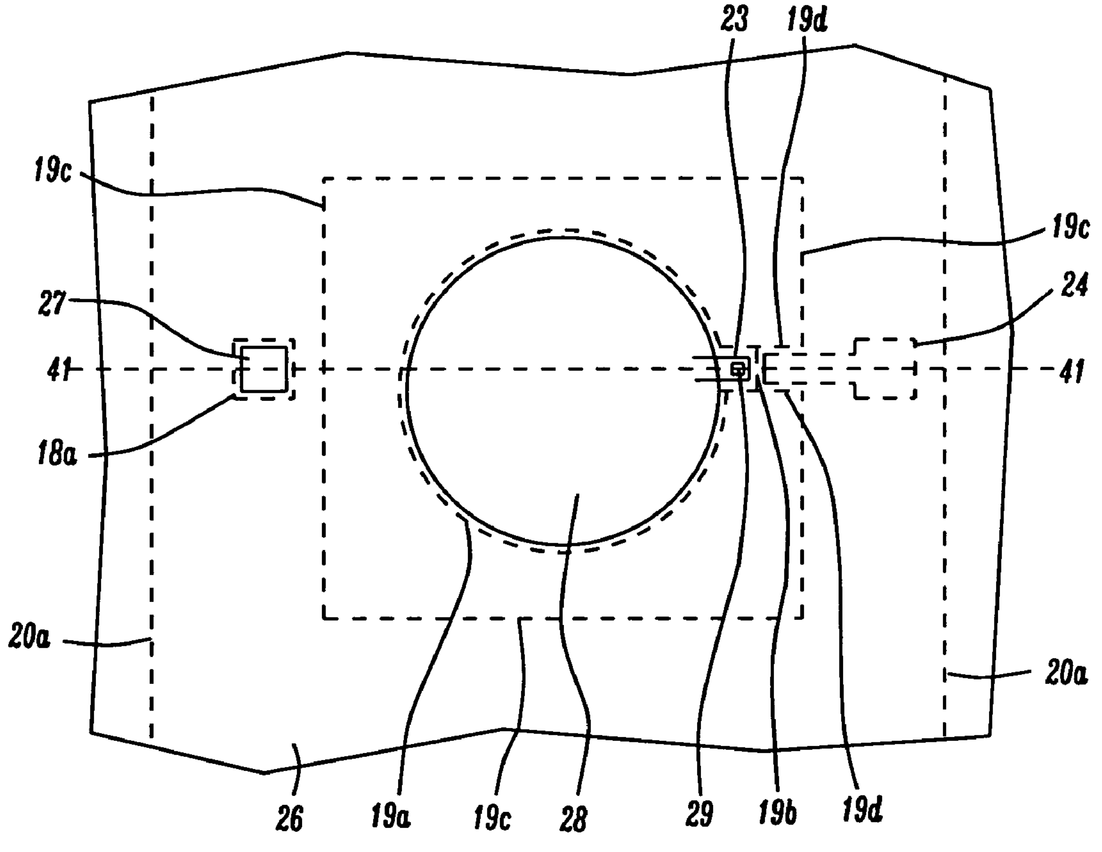

Referring to FIG. 3b, a top view is shown of the partially fabricated microphone sensing element 10 in FIG. 3a. The cross-section in FIG. 3a is taken along the axis 41-41 in FIG. 3b. Openings 27, 28, 29 are shown in the oxide layer 26. The location of other important features including filled trenches 18a, 19a-19d, 20a as well as openings 23, 24 are indicated by dashed lines since they are not visible from a top view. The filled trench 19a has a "C" like ring shape open on one side where the lead-out arm (not shown) is attached. Filled trench 19c has a ring shape that surrounds the opening 28 and is connected to trench 19a by two parallel trenches 19d. Trench 19b connects the two trenches 19d between the openings 23, 24. Opening 24 has a lengthwise dimension along the axis 41-41 and may have a rectangular shape in one section near the trenches 19a, 19b and a square shape in a second section below where a first electrode 30b (not shown) will subsequently be formed.

Figure 4A:
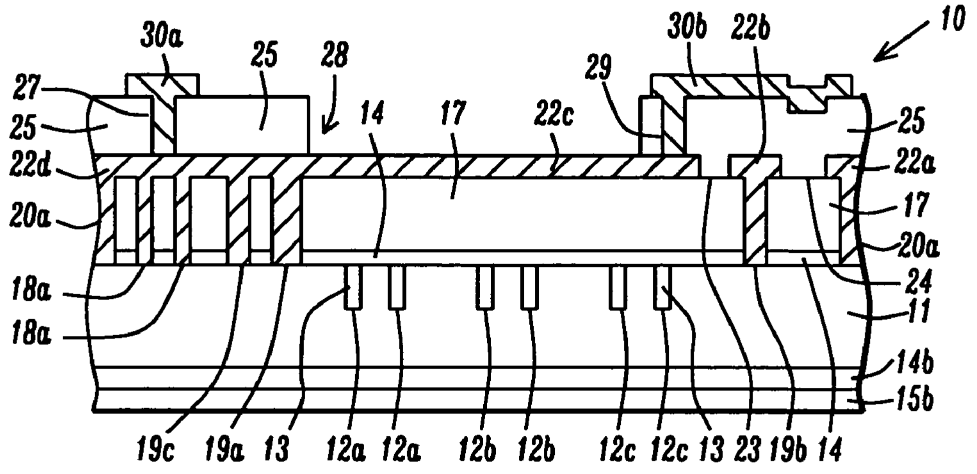

Referring to FIG. 4a, once the openings 27, 28, 29 are formed, the remaining oxide layer 26 is stripped by a conventional method. A conductive layer is formed by a physical vapor deposition (PVD) process or the like on the SRN layer 25 and fills the openings 27, 28, 29. Preferably, the conductive layer is a composite layer comprised of a lower Cr layer with a thickness from 600 to 800 Angstroms and an upper Au layer having a thickness between 5000 and 10000 Angstroms. However, the conductive layer may also be a single layer or composite layer comprised of Al, Ti, Ta, Cu, Ni, or other conductive materials. Thereafter, a fifth mask is used for a wet etch that selectively removes portions of the conductive layer. The remaining conductive layer is comprised of a first electrode 30b formed on the SRN layer 25 and aligned in a rectangular shape above the lead-out arm 22f and horizontal sections of rigid layers 22a, 22b. The first electrode 30b fills the opening 29 and contacts the top surface of the lead-out arm 22f and is thereby electrically connected to the diaphragm 22c. The remaining conductive layer is also comprised of a second electrode 30a formed on the SRN layer 25 over the rigid layer 22d. The second electrode 30a fills the opening 27 and thereby contacts the horizontal section or rigid layer 22d. Thus, an electrical connection is established between the second electrode 30a and substrate 11.

Figure 4B:
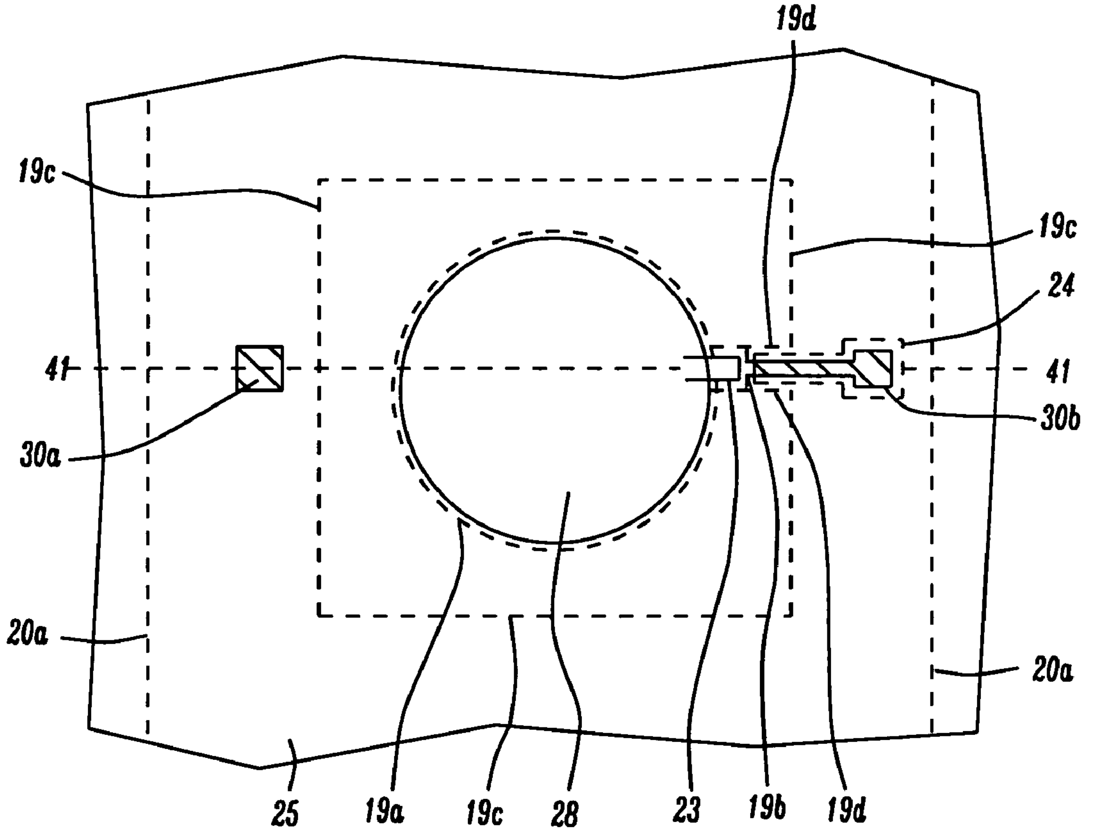

Referring to FIG. 4b, a top down view of the microphone sensing element 10 in FIG. 4a is depicted. Note that the first electrode 30b has the general shape of the opening 24 except that the end nearer the opening 28 extends over the trench 19b and opening 29 (not shown) along the axis 41-41. In other words, the first electrode may be comprised of a rectangular section with a lengthwise direction along the axis 41-41 and one end above the lead-out arm 22f and a square section at its other end that is nearer the trench 20a. The widthwise dimension (perpendicular to the axis 41-41) of first electrode 30b is typically less than the widthwise dimension of the opening 24.

Figure 5A:
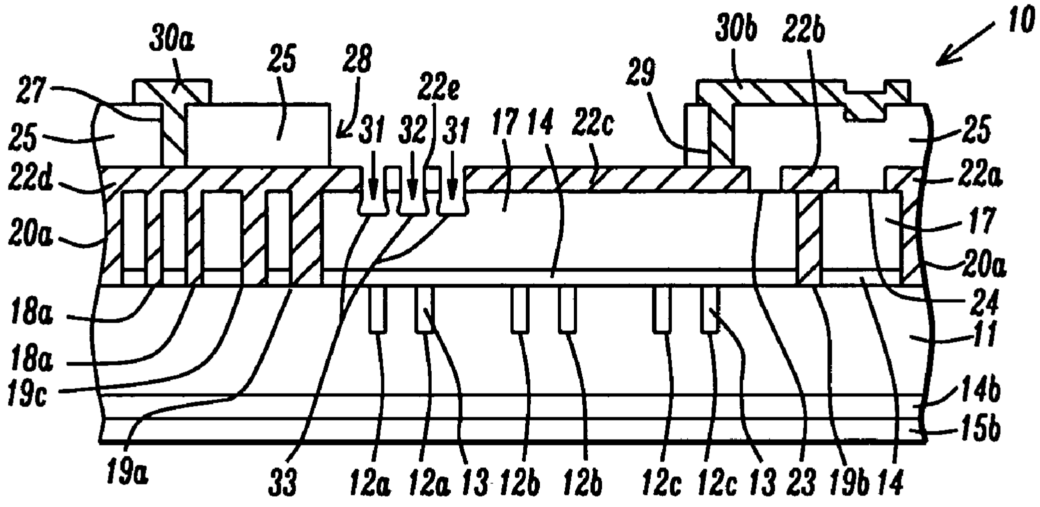

Referring to FIG. 5a, a sixth mask is employed during a reactive ion etch (RIE) or plasma etch to generate a first set of openings 31 in the horizontal section 22d, a second set of openings 31 in the diaphragm 22c, and a trench 32 with a "C" like ring shape that defines the edge 22e of the diaphragm. The openings 31 are preferably holes and may form a circular pattern on either side of the trench 32 as described previously. A wet etch is performed to remove portions of the PSG layer 17 below the openings 31 and trench 32 to form the undercut cavities 33. The wet etch is considered anisotropic and may be a timed process intended to etch the PSG layer 17 to a depth of about 2 microns below the diaphragm 22*c* and horizontal section of rigid layer 22*d*.

Figure 5B:
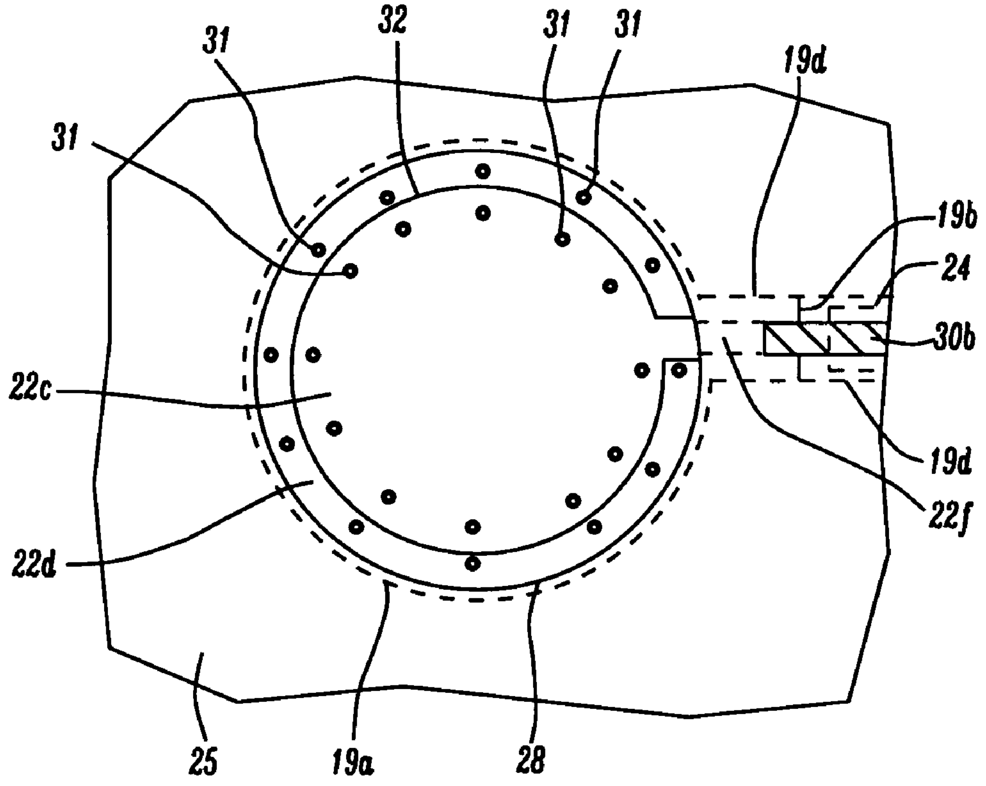

Referring to FIG. 5*b*, a top down view is shown of a portion of the sensing element 10 in FIG. 5*a*. The first and second sets of holes 31 essentially form concentric patterns with the trench 32. A hole in the first set may be disposed opposite a hole in the second set. The trench 32 is interrupted in a region of the diaphragm 22*c* where the lead-out arm 22*f* adjoins the diaphragm.

Figure 6A:
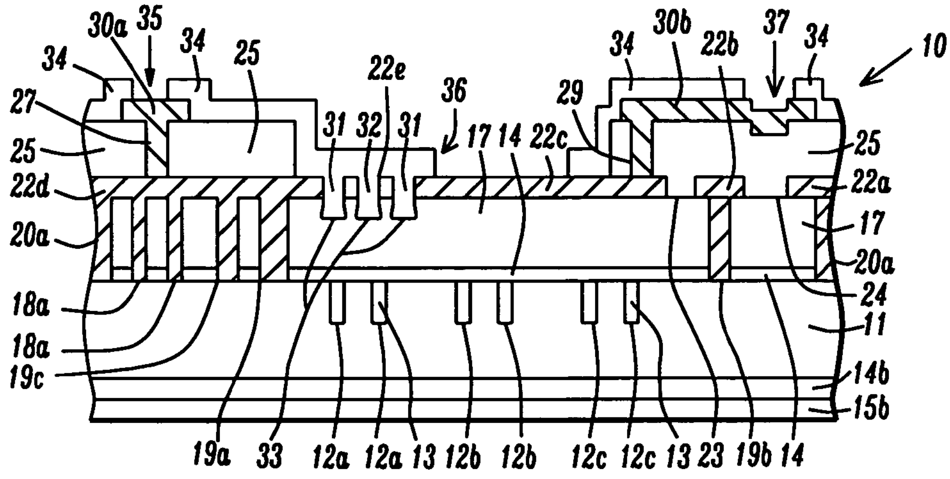

Referring to FIG. 6*a*, a soft polymeric film having a Young's modulus substantially less than that of the diaphragm 22*c* and an elasticity higher than the diaphragm is formed by a conventional method on the SRN layer 25, first electrode 30*b*, second electrode 30*a*, horizontal section 22*d*, diaphragm 22*c*, and portions of lead-out arm 22*f*. In one embodiment, the soft polymeric film hereafter referred to as a soft constraint 34 is comprised of parylene. Alternatively, the soft constraint 34 may be a single layer or composite layer comprised of PMMA, Teflon, PDMS, SU8 photoresist, or other elastic materials as appreciated by those skilled in the art. The soft constraint 34 has a thickness of 3 to 10 microns and fills the openings 31, trench 32, and undercut cavities 33. A seventh mask is used in a dry etch process that selectively removes portions of the soft constraint 34 including an opening 36 above the diaphragm, an opening 35 above the second electrode 30*a*, and an opening 37 over the first electrode 30*b*.

Figure 6B:
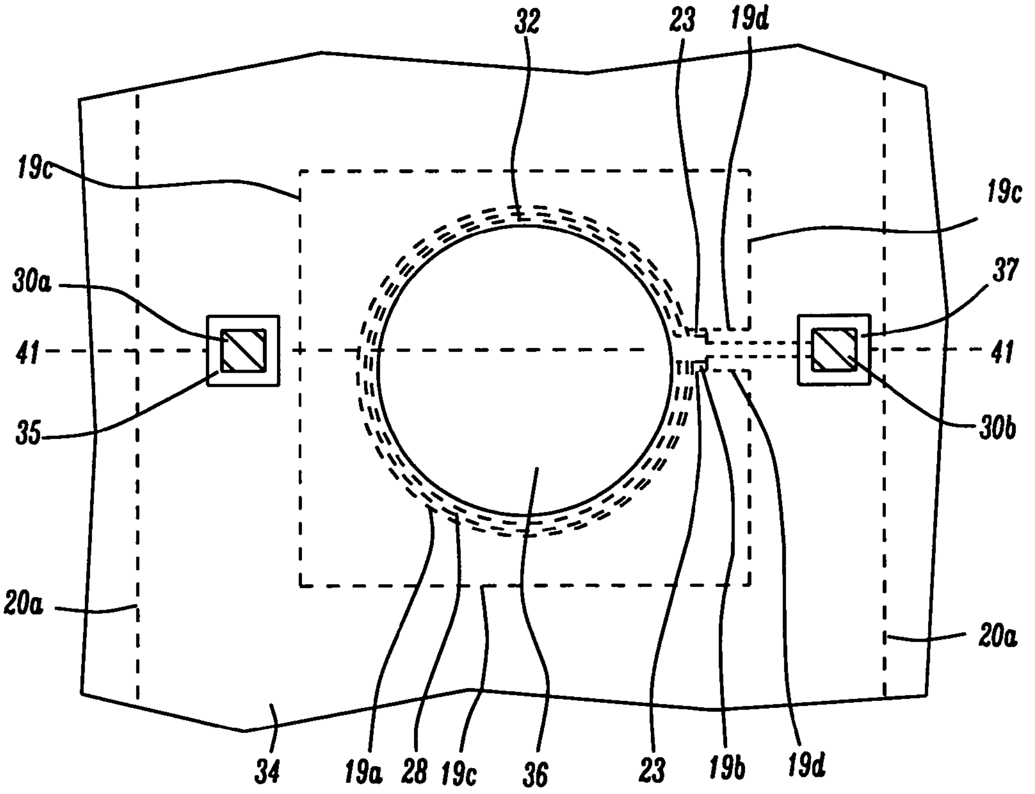

In the top down view shown in FIG. 6*b*, the openings 35, 36, 37 are shown in the soft constraint layer 34. Opening 35 may have a slightly larger width than the width of second electrode 30*a* and opening 37 may have a slightly larger width than the width of the square section near one end of first electrode 30*b*. Most of the rectangular section of the first electrode 30*b* remains covered by the soft constraint.

Referring to FIG. 7, an eighth mask is used to selectively remove a portion of the silicon nitride layer 15*b* and thermal oxide layer 14*b* that are aligned below the diaphragm 22*c*. The silicon nitride/oxide hardmask stack on the back side is plasma etched by a conventional method. A KOH wet etch is then performed to form a back hole 38 with sloping sidewalls in the substrate 11. The back hole 38 stops on the filled trenches 12*a*-12*c* and the top portion adjacent to the trenches 12*a*-12*c* has a width that is equal to or greater than the diameter of the diaphragm. After the KOH etch, the oxide layer 13 within the trenches 12*a*-12*c* is removed by a wet etch that may involve a buffered HF solution known to those skilled in the art.

The substrate 11 is diced to separate sensing elements from each other. Then a release process is performed that sequentially removes the oxide layer 14 and PSG layer 17 above the trenches 12*a*, 12*b*, 12*c* which become acoustic holes 12*d* during the release process. Note that a region of substrate 11 contained within each ring shaped trench 12*a*, 12*b*, 12*c* drops off after the adjacent oxide layer 14 is removed. More than one step may be employed to form the air gap 39. For example, in an embodiment wherein the dielectric stack is comprised of both silicon oxide and silicon nitride layers, a BHF solution may be used to remove a silicon oxide layer and a dry plasma etching may be employed in a second step to remove a silicon nitride layer. The resulting backplate 42 has a thickness $t_2$ with acoustic holes 12*d* having a width $d_1$ as described previously. The air gap between the diaphragm 22*c* and backplate 42 has a thickness $t_1$ of about 4 microns.

The first process sequence illustrated in FIGS. 1*a*-7 is an advantage over prior art methods practiced by the inventors since the intrinsic stress of the diaphragm is relieved and its fabrication can be accomplished with only eight masks. This simplification results in a considerable cost savings that makes the silicon microphone sensing element according to the first embodiment more cost effective and with a higher production yield than other silicon microphone sensing elements. Moreover, each of the steps in the first process sequence may be performed with conventional semiconductor tools, photoresists, and etchants.

According to the present invention, a second process sequence shown in FIGS. 10-15 is a second embodiment of fabricating a silicon microphone sensing element. The second process sequence involves a total of seven masks wherein each mask is used in a process that typically includes exposure of a photoresist film, pattern development, etching, and photoresist removal. These masks are not illustrated in full detail in order to simplify the drawings.

Figure 10:
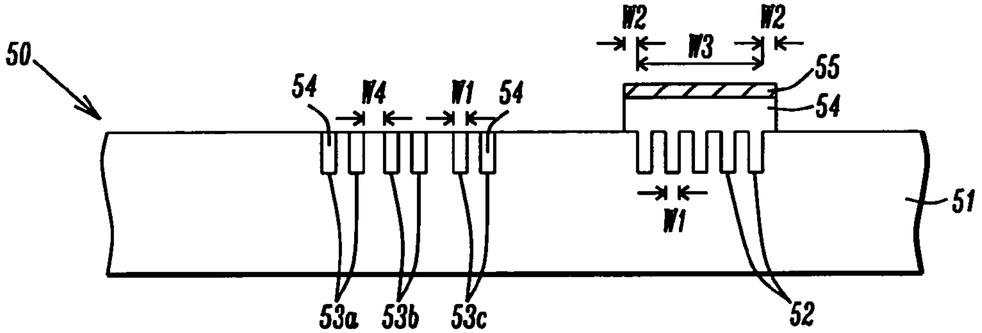
FIGS. 10, 11*a*, 12-15 are cross-sectional views that illustrate a process sequence involving seven photo mask steps which form a silicon microphone sensing element with a softly constrained diaphragm according to a second embodiment of the present invention.

Referring to FIG. 10, the silicon microphone sensing element 50 is based on a substrate 51 as previously described which may have a (1,0,0) crystal orientation. A first mask is used to selectively etch trenches 52, 53*a*, 53*b*, 53*c* having a width $w_1$ of about 2 to 4 microns and a depth of from 10 to 20 microns and preferably about 15 microns in the substrate 51. The trenches 52, 53*a*-53*c* may be etched by a deep reactive ion etching (DRIE) method. The trenches 52 in a first region of the substrate are part of a pattern that may have a width $w_3$. Trenches 53*a*-53*c* in a second region of the substrate are part of a plurality of trenches that forms a pattern of circular or square ring shapes from a top view similar to trenches 12*a*-12*c* described previously in the first process sequence. The distance $w_4$ between neighboring trenches in the second region is about 20 microns. As shown in FIG. 17, the pitch P is about 40 microns. The trenches in the second region are formed in what will become a backplate region of the substrate 51.

Returning to FIG. 10, a dewet process is performed at this point. Next, a conventional thermal oxidation may be performed to grow a first oxide layer 54 about 2 microns above the substrate that fills the trenches 52, 53*a*-53*c*. An undoped polysilicon (poly 1) layer 55 about 3000 to 5000 Angstroms thick is deposited on the oxide layer 54 by a LPCVD method. A second mask is employed to selectively remove the poly 1 layer 55 and oxide layer 54 except in one or more regions above the trenches 52 that extend a distance $w_2$ of about 10 microns around the trenches. Additionally, the oxide layer 54 remains in trenches 53*a*-53*c*. The oxide filled trenches 52 will serve to reduce substrate parasitic capacitance in the final device.

Figure 11A:
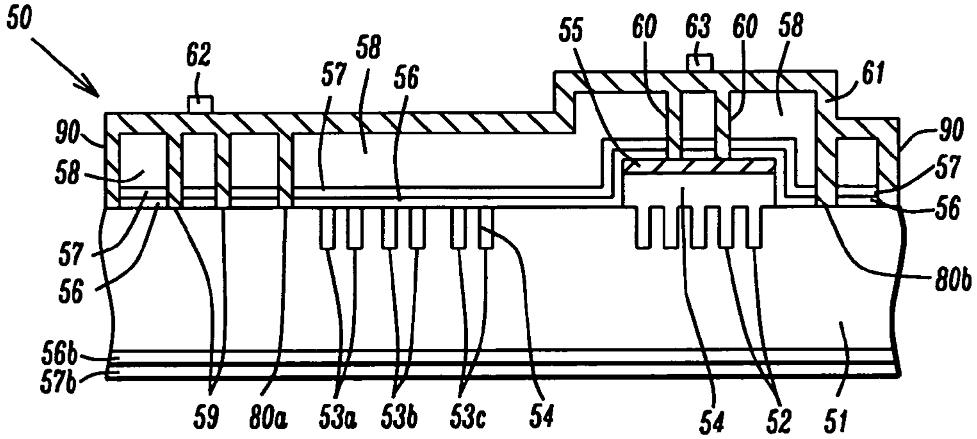

Referring to FIG. 11*a*, a second oxide layer 56 having a thickness of about 3000 Angstroms is formed on the front side of the substrate 51 and a second oxide layer 56*b* with the same thickness is grown on the back side by a conventional process. The second oxide layers 56, 56*b* may be thermal oxide or an LPCVD low temperature oxide. Next, silicon nitride layers 57, 57*b* with a thickness of about 1500 Angstroms are deposited by a LPCVD process on the front and back sides, respectively, to cover the thermal oxide layers 56, 56*b*. A third oxide layer 58 with a thickness of about 4 microns is formed on the silicon nitride layer 57 by a PECVD or LPCVD low temperature process. Optionally, the third oxide layer may be comprised of TEOS or a PSG layer. The layers 56, 57, 58 form a dielectric stack and the layers 56*b*, 57*b* form a hardmask. Alternatively, the dielectric stack may be comprised of single or composite sacrificial layers such as oxide layers, TEOS, PSG, and nitride layers, and the hardmask may be a single layer comprised of either an oxide layer or a silicon nitride layer. Preferably, the dielectric stack is comprised of dielectric layers that can be selectively removed without attacking the diaphragm and backplate during formation of the air gap in a subsequent step.

A third mask is used to form trenches 59, 60, 80*a*, 80*b*, 90 as well as trench 80*c* (not shown) in the oxide layer 58 that extend through the silicon nitride layer 57 and oxide layer 56. Trenches 59, 80*a*-80*c*, 90 stop on the substrate 51 while trench 60 stops on the poly 1 layer above the filled trenches 52 in a first region of the substrate. Regions of the dielectric stack surrounded by trenches 59, 60, 80*a*, 80*b*, 90 are sometimes called isolations regions.

In the exemplary embodiment, a semiconductor layer 61 that serves as a supporting layer and is comprised of polysilicon with a thickness of about 1 to 3 microns is then formed on the oxide layer 58 by a LPCVD process, for example, and may have stress, sheet resistance, and strain gradient values as mentioned earlier. The resulting polysilicon layer 61 is non-planar and is formed a greater distance from the substrate in a region aligned over the trench 60 than in a region above the trenches 53*a*-53*c* or above the trench 59. Alternatively, the semiconductor layer 61 may be a single or composite layer comprised of doped polysilicon, silicon, nickel, gold, aluminum, copper, nitride, or other semiconductor thin films used in the art.

Returning to the exemplary embodiment, a conductive layer is disposed on the polysilicon layer 61 and is preferably a composite layer comprised of a lower Cr layer and an upper Au layer as previously described that may be formed by a PVD method. Optionally, the conductive layer may be a single or composite layer comprised of Al, Ti, Ta, Ni, Cu, or other conductive materials. Thereafter, a fourth mask is used during a wet etch that selectively removes portions of the conductive layer. The remaining conductive layer is comprised of a first electrode 63 disposed on the polysilicon layer 61 above the filled trenches 52 and a second electrode 62 formed on the polysilicon layer above the trench 59.

Figure 11B:
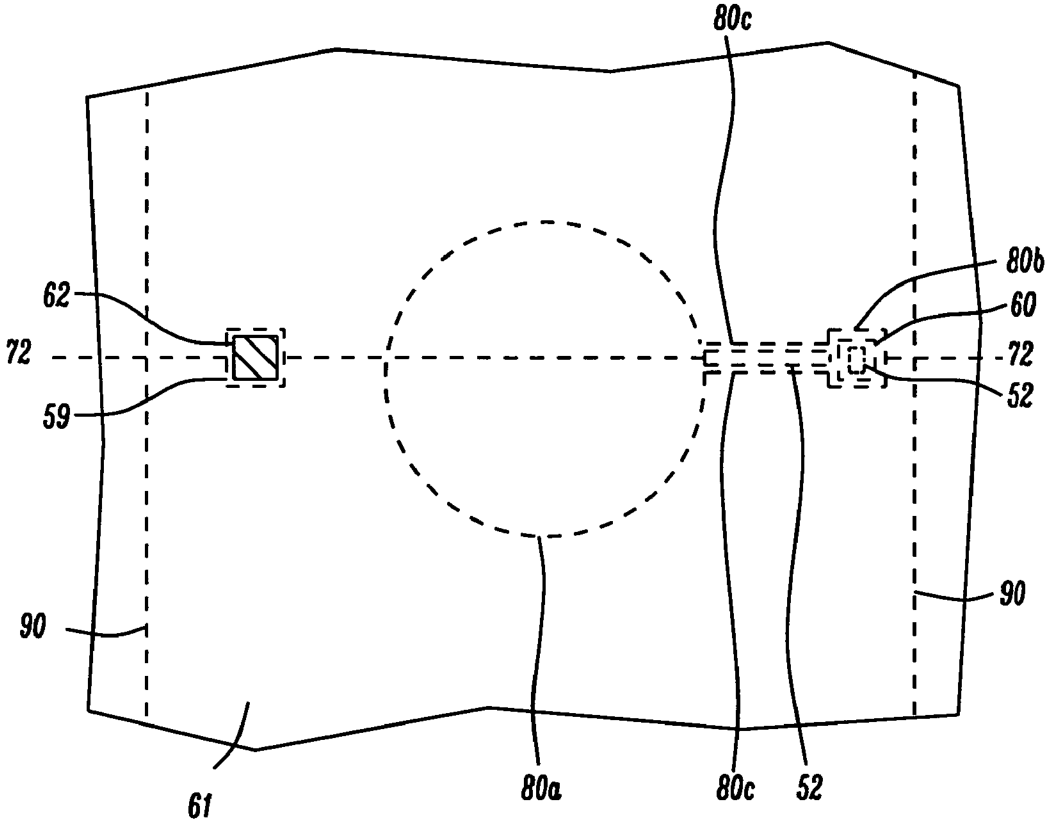
FIG. 11*b* is a top view of the microphone sensing element shown in FIG. 11*a*.

Referring to FIG. 11*b*, trenches 59, 60 form essentially square ring shapes. Trench 80*a* is a "C" shaped trench connected to trenches 80*b* by parallel trenches 80*c* as described earlier. Trench 90 also has a ring shape although only two parallel sides are shown in this view. The width of trench 59 may be larger than the width of second electrode 62. The width of trench 60 may be larger than the width of the first electrode 63 (not shown). Buried oxide filled trenches 52 are shown as dashed lines to indicate their position relative to trenches 80*c* and trench 60.

Figure 12:
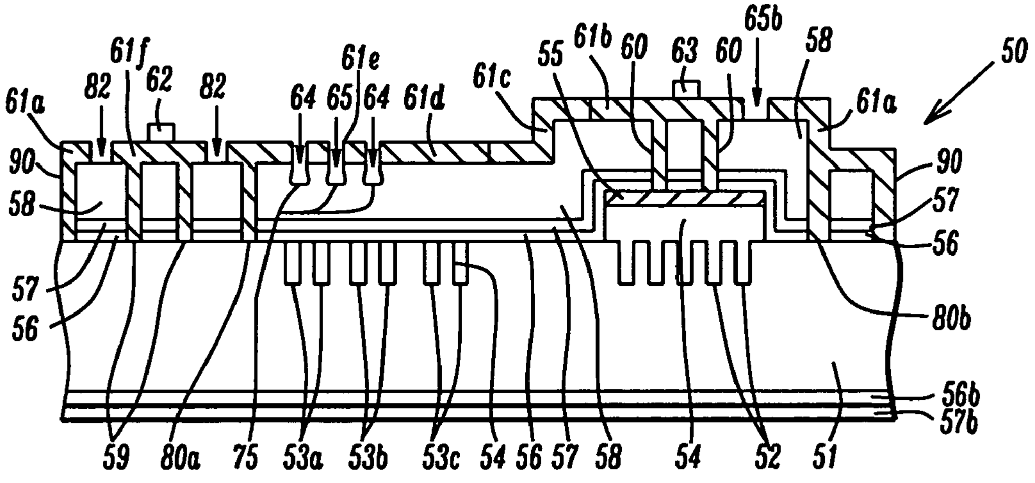

Referring to FIG. 12, a fifth mask is employed during a RIE or plasma etch of the polysilicon layer 61. Note that the polysilicon layer has been assigned different divisions including rigid foundations 61*a*, 61*b*, 61*f* having horizontal and vertical sections, and a diaphragm 61*d* with an electrical lead-out arm 61*c*. The etch process with the fifth mask produces a first set of holes 64 in the horizontal section of the rigid foundation 61*a*, a second set of holes 64 in the diaphragm 61*d*, and a trench 65 with a "C" like shape that defines the edge 61*e* of the diaphragm. The holes 64 may form a circular pattern on either side of the trench 65 as noted earlier. In a following step, a wet etch using a BHF solution, for example, is performed to remove portions of the oxide layer 58 below the holes 64 and trench 65 to form undercut cavities 75. The wet etch may be a timed process intended to etch the oxide layer 58 that results in undercut cavities 75 with a depth of 2 to 3 microns below the horizontal section of foundation 61*a* and diaphragm 61*d*.

Figure 13:
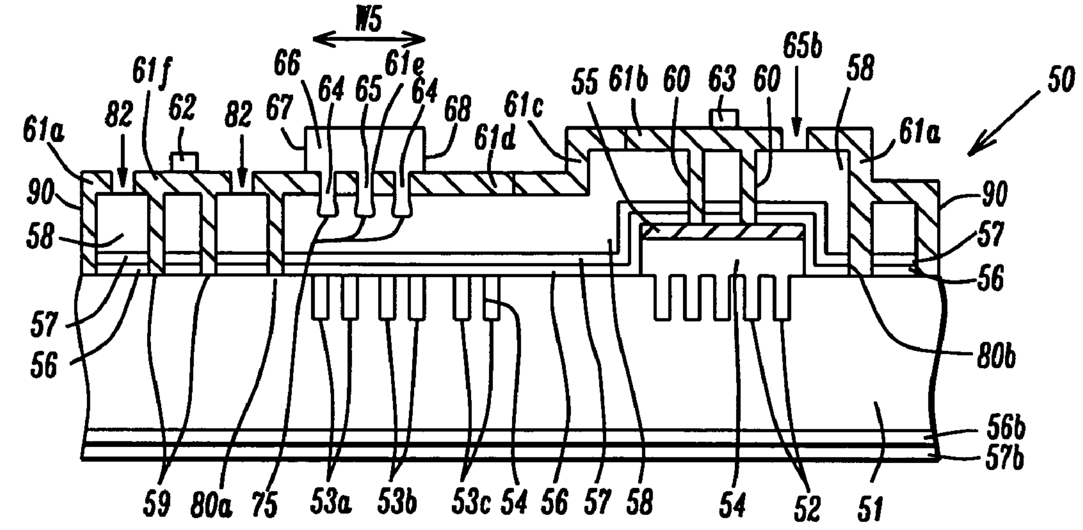

Referring to FIG. 13, a soft polymeric film having a Young's modulus substantially less than that of the diaphragm 61*d* is formed on the electrodes 62, 63, horizontal sections of foundations 61*a*, 61*b*, diaphragm 61*d*, and arm 61*c* by a conventional method involving evaporation or spin coating. In one embodiment, the soft polymeric film also known as a soft constraint 66 is comprised of parylene. The soft constraint 66 advantageously has an elasticity substantially higher than that of the diaphragm. Alternatively, the soft constraint 66 may be a single layer or composite layer comprised of PMMA, Teflon, PDMS, SU8 photoresist, or other elastic materials with a low Young's modulus as appreciated by those skilled in the art. The soft constraint 66 has a thickness of 3 to 10 microns in an upper section and fills the holes 64, undercut cavities 75, and the trench 65. A sixth mask is used in a dry etch process that selectively removes portions of the soft constraint 66 in its upper section to leave only an "O" shaped ring with an outer side 67 and an inner side 68 above the horizontal section of foundation 61*a* and diaphragm 61*d*. The lower section in the undercut cavities 75 and the soft constraint 66 in the holes 64 and trench 65 are not affected by the dry etch.

Figure 14:
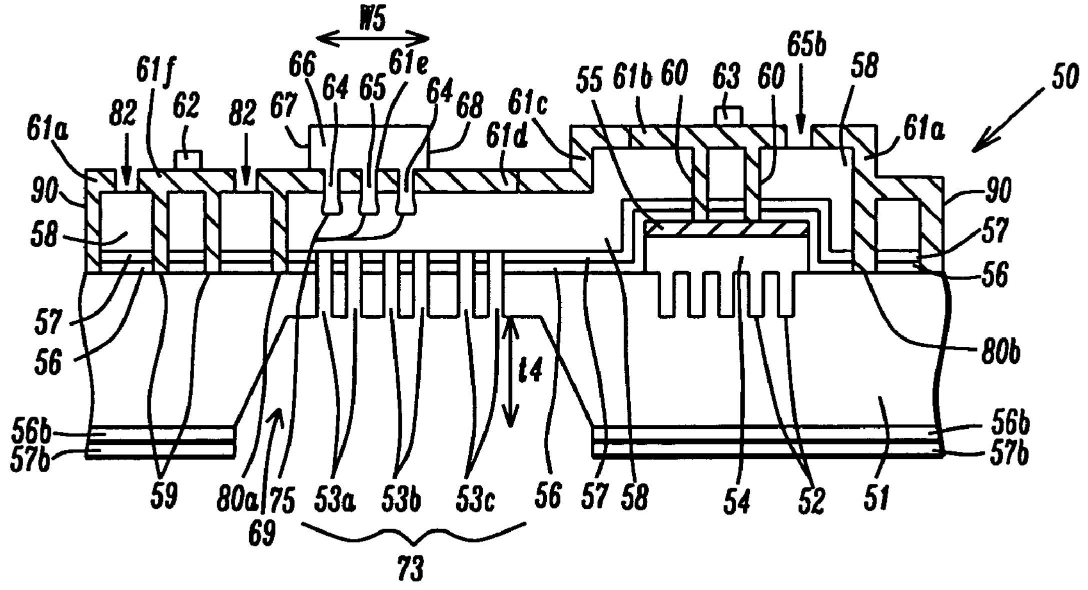

Referring to FIG. 14, a back hole 69 is generated by using a seventh mask and a conventional plasma etching process to selectively etch portions of the oxide layer 56*b* and silicon nitride layer 57*b* and form a hardmask opening. A KOH treatment as described earlier is employed to form a back hole in the substrate 51 that stops on the oxide filled trenches 53*a*-53*c*. The top of the back hole 69 is bounded by the backplate 73. Next, a wet oxide etch process known to those skilled in the art is performed to remove the oxide layer 54 in the trenches 53*a*-53*c* as well as extend the trenches through portions of the oxide layer 56 and silicon nitride layer 57.

Referring to FIG. 15, the substrate 51 is diced to separate microphone sensing elements from each other. Then a release process involving a BHF solution, for example, is performed that sequentially removes the oxide layer 58 above the trenches 53*a*, 53*b*, 53*c* which become acoustic holes 70. Note that a center region comprised of the substrate contained within each of the aforementioned trenches drops off during the release process. Additionally, an air gap 71 is formed with a thickness $t_3$ between the diaphragm 61*c* and backplate 73. The resulting backplate 73 has a thickness $t_2$ with acoustic holes 70 having a diameter $d_1$ as described previously. Although the lead-out arm 61*c* is non-planar, the air gap 71 has essentially a constant thickness $t_3$ between the bottom surface of the arm and the silicon nitride layer 57.

As pictured in FIG. 16, the edge of the diaphragm 61*d* is covered by the soft constraint 66 that has an "O" like shape and relieves the intrinsic stress in the diaphragm. The soft constraint 66 is connected along its outer edge 67 to the rigid horizontal sections of the foundations 61*a*, 61*b*. Therefore, when the diaphragm and arm are in a vibrational mode induced by pressure from a sound signal, the foundations 61*a*, 61*b* hold the soft constraint 66, diaphragm 61*b*, and lead-out arm 61*c* in place.

The advantages of the second process sequence are the same as those mentioned previously for the first process sequence and with the added benefit that fewer materials (no SRN layer) are required and the number of masks required is further reduced from eight to seven. Reduction of substrate parasitic capacitance is realized by oxide filled trenches in the substrate rather than with a SRN layer.

While this invention has been particularly shown and described with reference to, the preferred embodiments thereof, it will be understood by those skilled in the art that various changes in form and details may be made without departing from the spirit and scope of this invention.

We claim:

1. A silicon microphone sensing element with a softly constrained diaphragm, comprising:

(a) a diaphragm comprised of a semiconductor layer, said diaphragm has an edge, bottom surface, and a plurality of holes formed an equal distance from said edge and from a first trench that defines said edge wherein said diaphragm is formed over a backplate region with acoustic holes in a front side of a substrate and above a back hole with an opening in a back side of the substrate, said backplate region and diaphragm are separated by an air gap;

(b) an electrical lead-out arm that extends from the edge of said diaphragm and is comprised of the same semiconductor material as in the diaphragm and has a shape defined by a set of second trenches in the semiconductor layer;

(c) a rigid semiconductor layer having a plurality of horizontal sections disposed on a dielectric stack on said front side of the substrate, a plurality of holes formed an equal distance from the trench surrounding the diaphragm edge, and vertical sections that connect said horizontal sections and said front side of the substrate;

(d) a dielectric spacer stack disposed on a portion of said horizontal sections and having openings formed therein on said diaphragm and said electrical lead-out arm;

(e) a first electrode formed on said dielectric spacer stack and within an opening that contacts said electrical lead-out arm; and a second electrode formed on said dielectric spacer stack and within an opening that contacts a horizontal section of said rigid semiconductor layer;

(f) a soft constraint layer having an upper section formed above the edge of said diaphragm, above and within the first trench and plurality of holes, and above a portion of the rigid semiconductor layer, and having a lower section attached to the bottom surface of the diaphragm and rigid semiconductor layer adjacent to the first trench and plurality of holes; and (g) a substrate with front and back sides, a back hole formed in the substrate with an opening in said back side, and a backplate region with acoustic holes formed between the back hole and front side of the substrate.

2. The silicon microphone sensing element of claim 1 wherein said substrate is comprised of conductive silicon.

3. The silicon microphone sensing element of claim 1 wherein the diaphragm and the horizontal sections of said rigid semiconductor layer are a single or composite layer comprised of doped polysilicon, silicon, nickel, gold, aluminum, nitride, or other semiconductor materials.

4. The silicon microphone sensing element of claim 1 wherein the first trench separates the diaphragm from the rigid semiconductor layer and the set of second trenches separates the electrical lead-out arm from the rigid semiconductor layer, said first trench and set of second trenches are connected to form a continuous opening around the diaphragm and electrical lead-out arm.

5. The silicon microphone sensing element of claim 1 wherein said soft constraint is a single or composite material layer comprised of parylene, Teflon, PMMA, PDMS, SU8 photoresist, or other materials having a higher elasticity than the diaphragm and a substantially lower Young's modulus than the diaphragm.

6. The silicon microphone sensing element of claim 1 wherein the first electrode and the second electrode are a composite layer comprised of Au/Cr or are a single layer or composite layer comprised of Al, Ti, Ta, Cu, Ni, or other conductive materials.

7. The silicon microphone sensing element of claim 1 wherein said dielectric stack is a single or composite sacrificial layer comprised of one or more of silicon oxide, TEOS, PSG, and silicon nitride.

8. The silicon microphone sensing element of claim 1 wherein said dielectric spacer stack is comprised of a silicon rich silicon nitride (SRN) layer.

9. The silicon microphone sensing element of claim 1 wherein said acoustic holes in the backplate region have a square or circular shape and are formed in multiple rows and columns.

10. The silicon microphone sensing element of claim 1 wherein the air gap is bounded by vertical sections of the rigid semiconductor layer.

11. The microphone sensing element of claim 1 further comprised of a hard mask formed on the back side of said substrate and surrounding the back hole wherein said hard mask is a single layer comprised of either a thermal oxide or a silicon nitride layer, or is a composite layer comprised of a thermal oxide layer and a silicon nitride layer.

* * * * *